United States Patent
Onishi et al.

(10) Patent No.: US 8,319,396 B2
(45) Date of Patent: Nov. 27, 2012

(54) PIEZO-ELECTRIC ACTUATOR AND ELECTRONIC DEVICE

(75) Inventors: Yasuharu Onishi, Tokyo (JP); Yasuhiro Sasaki, Tokyo (JP); Masatake Takahashi, Tokyo (JP); Ukyo Mori, Tokyo (JP); Yukio Murata, Tokyo (JP)

(73) Assignee: NEC Corporation, Tokyo (JP)

( * ) Notice: Subject to any disclaimer, the term of this patent is extended or adjusted under 35 U.S.C. 154(b) by 684 days.

(21) Appl. No.: 12/159,427

(22) PCT Filed: Dec. 26, 2006

(86) PCT No.: PCT/JP2006/325912
§ 371 (c)(1),
(2), (4) Date: Jun. 27, 2008

(87) PCT Pub. No.: WO2007/083497
PCT Pub. Date: Jul. 26, 2007

(65) Prior Publication Data
US 2010/0219722 A1 Sep. 2, 2010

(30) Foreign Application Priority Data
Dec. 27, 2005 (JP) .................................. 2005-374558

(51) Int. Cl.
*H01L 41/08* (2006.01)
(52) U.S. Cl. ........................................ 310/324; 310/334
(58) Field of Classification Search .................. 310/322, 310/324
See application file for complete search history.

(56) References Cited

U.S. PATENT DOCUMENTS

| | | | | |
|---|---|---|---|---|
| 3,206,558 A | * | 9/1965 | Shoot | 381/173 |
| 3,721,844 A | * | 3/1973 | Fong | 310/166 |
| 4,047,060 A | * | 9/1977 | Schafft | 310/322 |
| 4,190,783 A | * | 2/1980 | Massa | 310/324 |
| 5,446,332 A | * | 8/1995 | Rapps et al. | 310/324 |
| 5,767,612 A | * | 6/1998 | Takeuchi et al. | 310/324 |
| 7,550,899 B2 | * | 6/2009 | Fujiwara et al. | 310/324 |
| 7,629,730 B2 | * | 12/2009 | Fujiwara et al. | 310/369 |
| 2004/0256953 A1 | * | 12/2004 | Kitagawa et al. | 310/324 |
| 2006/0028097 A1 | | 2/2006 | Sashida et al. | |

FOREIGN PATENT DOCUMENTS

| | | |
|---|---|---|
| CN | 1710994 A | 12/2005 |
| JP | 4630425 | 10/1971 |
| JP | 57072497 | 5/1982 |

(Continued)

OTHER PUBLICATIONS

Office Action issued Nov. 15, 201 from the Japanese Patent Office in counterpart Japanese application No. 2007-554842.

(Continued)

*Primary Examiner* — Mark Budd
(74) *Attorney, Agent, or Firm* — Sughrue Mion, PLLC

(57) ABSTRACT

Piezo-electric actuator 50 of the present invention comprises piezo-electric element 10 for performing expansion/contraction motions in accordance with an electric field condition, seat 20 to which piezo-electric element 10 is adhered on at least one surface thereof, and supporting member 45 for supporting piezo-electric element 10 and seat 20, wherein piezo-electric element 10 and seat 20 vibrate up and down in accordance with the expansion/contraction motions of piezo-electric element 10. Seat 20 is connected to supporting member 45 through vibration 30 film which is less rigid than this seat 20.

16 Claims, 19 Drawing Sheets

FOREIGN PATENT DOCUMENTS

| JP | 57079799 | 5/1982 |
| JP | 57081799 | 5/1982 |
| JP | 61168971 | 7/1986 |
| JP | 07213997 | 8/1995 |
| JP | 2000140759 | 5/2000 |
| JP | 2000233157 | 8/2000 |
| JP | 2001017917 | 1/2001 |

OTHER PUBLICATIONS

Office Action dated Feb. 16, 2012 in Chinese Application No. 200680051895.5.

* cited by examiner

PIEZO-ELECTRIC ACTUATOR AND ELECTRONIC DEVICE

TECHNICAL FIELD

The present invention relates to a piezo-electric actuator for generating vibrations using a piezo-electric element, and an electronic device using the same.

BACKGROUND ART

Conventionally, electromagnetic actuators have been utilized as driving sources for acoustic elements such as loud speakers and the like because of its ease of handling. The electromagnetic actuator comprises a permanent magnet and a voice coil, and generates vibrations by the action of a magnetic circuit of a stator using a magnet. An electromagnetic speaker, in turn, generates sound by vibrations of a lowly rigid vibration plate of an organic film or the like which is fixed to a vibration section of an electromagnetic actuator.

Incidentally, the need for portable telephones and personal computers has increased in recent years, and associated therewith, small and power saving actuators have been increasingly demanded. However, since the electromagnetic actuator needs to apply a large current to the voice coil during its operation, it has a problem in power saving capabilities, and is not apt to a reduction in size and thickness from a structural viewpoint. In addition, the electromagnetic actuator must be electromagnetically shielded, when it is applied to an electronic device, in order to prevent evil influences due to leaking flux from the voice coil. From this aspect, the electromagnetic actuator is not either apt for use in small electronic devices such as portable telephones. Moreover, a reduction in size causes the voice coil to be made of a thinner wire, and a resulting increase in resistance of the wire can burn the voice coil as well.

In view of the problems mentioned above, piezo-electric actuators have been developed using a piezo-electric element such as piezo-electric ceramic or the like, which has such features as a small size and light weight, power saving capabilities, non-leaking flux and the like, for a driving source, as a thin vibration part which can substitute for the electromagnetic actuator. The piezo-electric actuator generates mechanical vibrations through motions of a piezo-electric element, and comprises, for example, a piezo-electric ceramic element (simply called a "piezo-electric element" as well) which is bonded to a seat.

The basic configuration of a piezo-electric actuator will be described with reference to FIGS. 1 and 2. FIG. 1 is a perspective view showing the configuration of a conventional piezo-electric actuator, and FIG. 2 is a cross-sectional view schematically showing how the piezo-electric actuator of FIG. 1 vibrates.

As shown in FIG. 1, piezo-electric actuator 550 comprises piezo-electric element 510 made of piezo-electric ceramics; seat 524 to which piezo-electric element 510 is fixed; and frame-shaped supporting member 527 for supporting the outer periphery of seat 524. As piezo-electric element 510 is applied with an AC voltage, piezo-electric element 510 performs expansion/contraction motions. As shown in FIG. 2, seat 524 deforms in a convex mode (indicated by solid lines) or deforms in a concave mode (indicated by broken lines) in accordance with the expansion/contraction motions. In this way, seat 524 vibrates in a vertical direction as viewed in the figures, with bonded area 524a serving as a fixed end and the center of the seat serving as a belly.

For reference, the piezo-electric actuator, though it is advantageous in a reduction in size ant thickness, exhibits poor performance as an acoustic element, in one aspect, as compared with the electromagnetic actuator. This is attributable to the piezo-electric element which is highly rigid and incapable of providing a sufficient average vibration amplitude as compared with the electromagnetic actuator. In other words, this is because, as the actuator has a small amplitude, sound pressure of an acoustic element is also reduced. On the other hand, JP-61-168971-A and JP-2000-140759-A disclose configurations which support the outer periphery of a seat by a beam which is relatively easy to deform in order to increase the amplitude of vibrations of an actuator.

Also, JP-2001-17917-A discloses, to the same effect, a technique for providing a large vibration amplitude with a plate spring which is created by slitting in a peripheral region of a seat along its circumference. JP-2001-339791-A also discloses a technique for widening a frequency characteristic by bonding the outer periphery of a seat with a supporting member through a curved supporting member.

DISCLOSURE OF THE INVENTION

However, the piezo-electric actuators described in JP-A-61-168971-A, JP-2000-140759-A, and JP-2001-17917-A are essentially used mainly as vibrators contained in portable telephones and the like, and are not at all considered for use in reproduction of music and the like as an acoustic element such as a speaker. In other words, when they are applied to vibrators, the amplitude can be simply extended only at particular frequencies, whereas when they are applied to speakers, even their frequency characteristics must be taken into consideration. Specifically, they must be configured to provide a sound pressure at a predetermined level or higher in a desired frequency band, for example, from 1 kHz to 10 kHz.

On the other hand, JP-2001-339791-A is intended to generate displacements both in a thickness direction and a radial direction of piezo-electric ceramics in a configuration in which the seat for restraining the piezo-electric ceramics is bonded with the curved supporting member. With this curved supporting member, it is possible to disperse stresses at characteristic points and an attenuation ratio, reduce distortions, and extend the band of the frequency characteristic, but since vibrations occur both in the radial direction and thickness direction, vibrations attenuate in a sound radiating direction. For this reason, it must be configured to provide a sound pressure level at a predetermined level.

When even the frequency characteristic is taken into consideration as an acoustic element, a simple increase in vibration amplitude of actuator is not sufficient, but the manner of vibrations is desirably brought closer to a piston shape as shown in FIG. 6B (again described later in detail in later descriptions).

It is an object of the present invention to provide a piezo-electric actuator and an electronic device which are capable of providing a large vibration amplitude and reproducing sound over a wide frequency band.

To solve the foregoing problem, a piezo-electric actuator of the present invention comprises a piezo-electric element for performing expansion/contraction motions in accordance with an electric field condition, a seat to which the piezo-electric element is adhered on at least one surface thereof, and a supporting member for supporting the piezo-electric element and the seat, wherein the piezo-electric element and the seat vibrate in a thickness direction of the piezo-electric element in accordance with the expansion/contraction motions of the piezo-electric element. The piezo-electric actuator is characterized in that the seat is connected to the supporting member through a vibration film which is less rigid than the seat.

In the piezo-electric actuator of the present invention configured in this way, the seat is connected to the supporting member through the vibration film which is less rigid than the seat, and a connection (vibration film section) between the seat and the supporting member is susceptible to deformation, as compared with the seat section, so that the vibration amplitude is improved. Also, such a susceptibility of the connection (vibration film section) to deformation means that vibrations become larger in this section, and accordingly, the vibration mode can be brought closer to a piston type (a vibration mode similar to the electromagnetic actuator), as compared with the conventional configuration. Further, since an impact in the event of dropping is absorbed by the vibration film which intervenes between the seat and the supporting member, dropping stability is high, and applications to portable devices and the like are also possible.

In this regard, the piezo-electric actuator of the present invention comprises the vibration film as described above, and sound can be generated by vibrating this vibration film. In other words, the piezo-electric actuator of the present invention can function as an acoustic element as it is without using an additional vibration film or the like.

As described above, according to the piezo-electric actuator of the present invention, since the seat to which the piezo-electric element is adhered and the supporting member are bonded through the vibration film which is less rigid than the seat, vibrations of large amplitude can be produced, and when this is used as an acoustic element, sound can be reproduced over a wide frequency band.

BEST MODE FOR CARRYING OUT THE INVENTION

In the following, embodiments of the present invention will be described with reference to the drawings. In the configu-

First Embodiment

Figure 3:
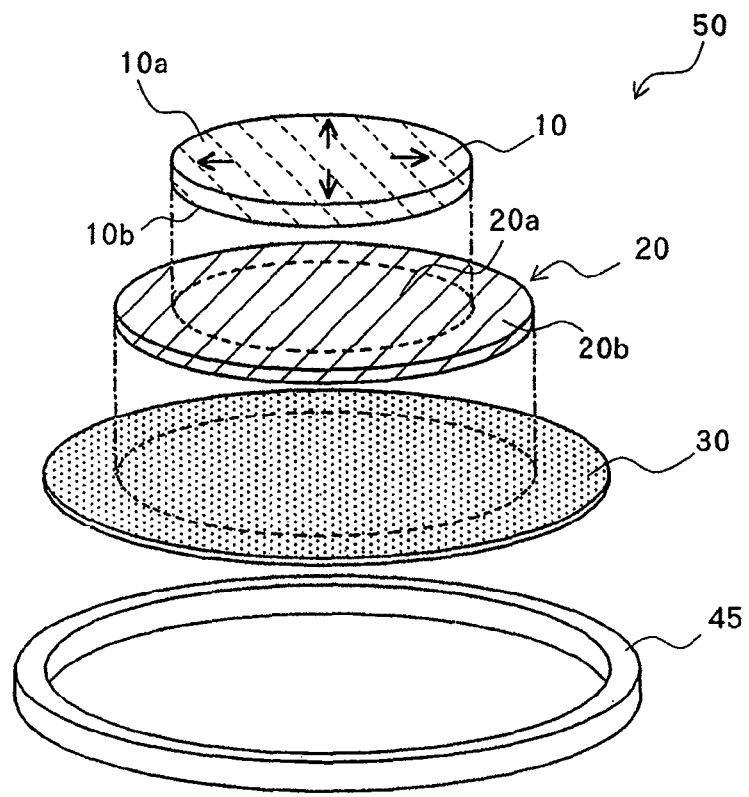
FIG. 3 An exploded perspective view showing the configuration of a piezo-electric actuator of a first embodiment.
Figure 4:
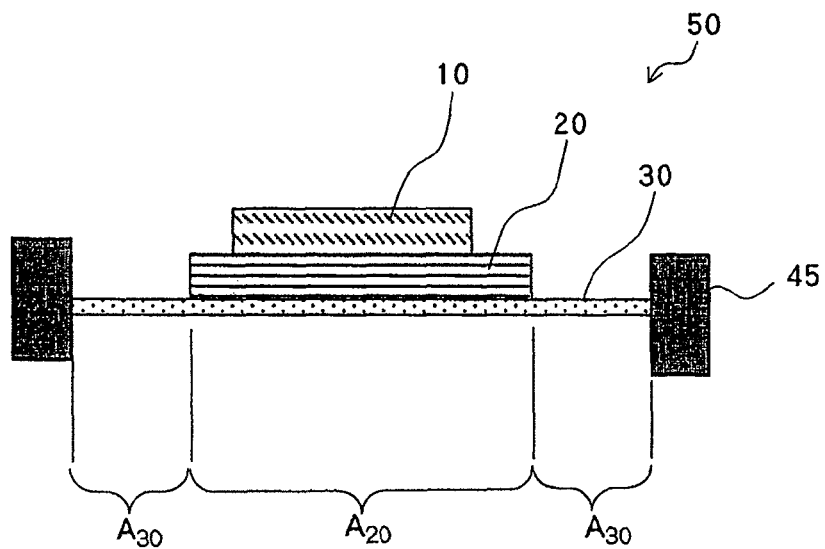
FIG. 4 A vertical sectional view of the piezo-electric actuator of FIG. 3

FIG. 3 is an exploded perspective view of a piezo-electric actuator of this embodiment, and FIG. 4 is a vertical sectional view of the piezo-electric actuator of FIG. 3.

As shown in FIGS. 3 and 4, piezo-electric actuator 50 of this embodiment comprises piezo-electric element 10 which serves as a driving source of vibration; seat 20 for supporting piezo-electric element 10; and vibration film 30 for supporting seat 20 in a configuration in which they are laminated in order. Piezo-electric element 10, seat 20, and vibration film 30 all have circularly shaped contours, and these three members are (concentrically) arranged such that they are centered at the same point. The outer periphery of vibration film 30 is connected to and supported by supporting member 45 which is formed in a circular frame shape.

More specifically, piezo-electric element 10 comprises a piezo-electric plate (piezo-electric ceramics) having two main surfaces 10a, 10b which oppose in parallel with each other, and an upper electrode layer and a lower electrode layer (neither of which is shown) are formed on main surfaces 10a, 10b, respectively, of the piezo-electric plate. While a polarization direction of the piezo-electric plate is not particularly limited, it is upward in a vertical direction (thickness direction of the piezo-electric element) in this embodiment, as shown in the figure. Piezo-electric element 10 thus configured performs expansion/contraction motions in the radial direction (radially expanding motions) such that both main surfaces 10a, 10b thereof expand or contract at the same time when an AC voltage is applied to the upper electrode layer and lower electrode layer to apply an alternating electric field. In other words, piezo-electric element 10 makes motions to repeat a first deformation mode in which the main surfaces expand and a second deformation mode in which the main surfaces contract.

Seat 20 has a function of converting the expansion/contraction motions of piezo-electric element 10 to vibrations in the vertical direction as shown in the figure. Seat 20 is formed of a resilient material (elastic material), and as its material, a material which is less rigid than a ceramic material which comprises the piezo-electric element can be widely used, such as a metal material (for example, aluminum alloy, phosphor bronze, titanium, or titanium alloy) or a resin material (for example, epoxy, acrylic, polyimide, or polycarbonate), and the like.

Main surface 10b (lower electrode layer) of piezo-electric element 10 is fixed on a top surface of seat 20, whereby seat 20 restrains piezo-electric element 10. In FIG. 3, an area of seat 20 on which piezo-electric element 10 is adhered is shown as restraining area 20a, and the remaining area (area surrounding restraining area 20a) is shown as non-restraining area 20b.

Vibration film 30 is a film member for increasing a vibration amplitude of the piezo-electric actuator, and is less rigid than seat 20. As a combination of materials of seat 20 with vibration film 30, for example, seat 20 may be a metal material, while vibration film 30 may be a resin material (for example, urethane, PTE, polyethylene or the like). Alternatively, seat 20 and vibration film 30 may be made of the same material, and by making the thickness of vibration film 30 relatively smaller, vibration film 30 may be made relatively less rigid. In this regard, vibration film 30 may be paper, polyethylene telephthalate or the like, other than those listed above.

The thickness of vibration film 30 may be for example, equal to or larger than 5 μm and equal to or smaller than 500 μm in the case of a resin material. Particularly, when vibration film 30 is a plane sheet material, the thickness may be preferably equal to or larger than 30 μm and equal to or smaller than 180 μm.

Incidentally, when a piezo-electric actuator is utilized as an acoustic element, an organic film or the like is often adhered to a vibrating section (for example, seat 20 and the like) of the piezo-electric actuator to generate sound. On the other hand, in this embodiment, vibration film 30 provided for increasing the amplitude additionally functions as a vibration film as it is. In other words, vibration film 30 simultaneously has not only a function as a vibration film in a conventional acoustic element but also a function of increasing the vibration amplitude of the actuator. In this regard, the conventional configuration intended to increase the amplitude with the provision of a beam (for example, JP-61-168971-A) differs from the configuration of the present invention. According to the configuration of the present invention, a larger sound pressure can be produced due to the fact that the vibration film is provided. Nevertheless, for designing an acoustic element, a plurality of piezo-electric actuators which differ in resonant frequency from one another may be adhered on a common vibration film to create a single acoustic element. In this way, they can mutually compensate for bands in which sound pressure levels are lower, thereby realizing an acoustic element which can provide a large sound pressure over a wider frequency range.

Seat 45 is a member which forms part of a housing of the piezo-electric actuator, and its material is not particularly limited and may be a resin material or a metal material. In this regard, for bonding piezo-electric element 10 with seat 20, and for bonding seat 20 with vibration film 30, an epoxy-based adhesive, for example, can be utilized. While an adhesive layer is not particularly limited in thickness, the thickness is preferably, for example, 20 μm or smaller because an excessively thick adhesive layer would absorb larger vibration energy, possibly failing to provide a sufficient vibration amplitude.

As shown in FIG. 4, piezo-electric actuator 50 is configured such that piezo-electric element 10 is fixed on the top surface of seat 20, and seat 20 is supported by supporting member 45 through vibration film 30. In this regard, piezo-electric actuator 50 differs from the conventional configuration (see FIG. 1) in which the seat is directly supported by the supporting member. According to the configuration of this embodiment, since seat 20 is supported through vibration film 30 in this way, a larger vibration amplitude can be produced, as compared with the conventional configuration, and moreover, a vibration mode approaches to a piston type (described later with reference to FIG. 6B). In the following, this will be described with reference to FIGS. 5A, 5B, together with a mechanism of generating vibrations of the piezo-electric actuator.

Figure 5A:
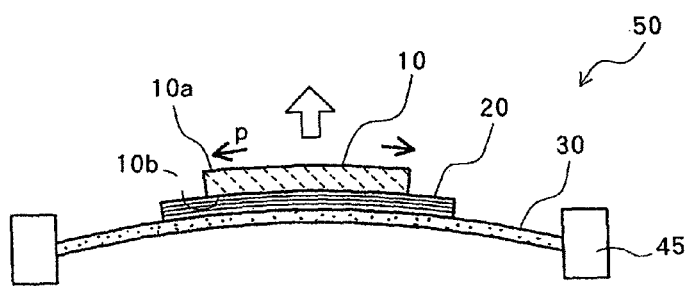
FIG. 5A A diagram for describing the operation principle of the piezo-electric actuator.

First, as a predetermined voltage (electric field) is applied to piezo-electric element 10 in a neutral state (see FIG. 4) in which no voltage is applied to the piezo-electric element, piezo-electric element 10 deforms in a direction in which its area expands, as indicted by arrows p in FIG. 5A. Here, since the bottom surface (main surface 10b) of piezo-electric element 10 is restrained by seat 20, a difference in the amount of deformation occurs between the top surface and the bottom surface of piezo-electric element 10 due to this restraining effect, resulting in a convex deformation mode, as shown. In this deformation mode, piezo-electric element 10 and seat 20, as well as vibration film 30 which supports seat 20 are curved to be convex upward as shown in the figure.

Figure 5B:
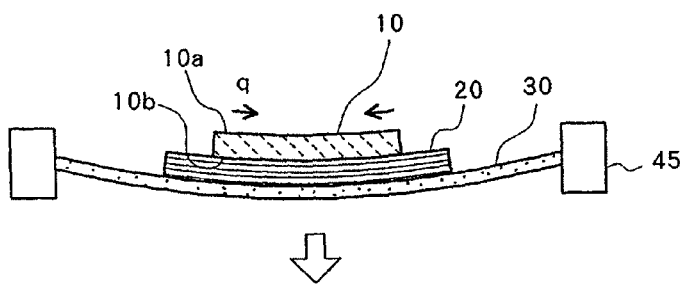
FIG. 5B A diagram for describing the operation principle of the piezo-electric actuator.

Subsequently, as the piezo-electric element is applied with an electric field reverse to the above, piezo-electric element 10 deforms, at this time, in a direction in which its area decreases, as indicated by arrows q in FIG. 5B. A difference in the amount of deformation occurs between the top surface and the bottom surface of piezo-electric element 10 due to the restraining effect by seat 20, resulting in a concave deformation mode as shown. In this deformation mode, contrary to the aforementioned, the piezo-electric element, seat, and vibration film are curved to be convex downward as shown in the figure.

Piezo-electric actuator 50 of this embodiment alternately repeats the convex type deformation mode and concave type deformation mode as mentioned above, causing piezo-electric element 10, restraining member 20, and vibration film 30 to vibrate in the vertical direction. When the actuator of this embodiment is compared with the conventional actuator (see FIG. 1), they are common in that motions of piezo-electric element 10 are transmitted to seat 20, and vibrations in the vertical direction are excited. However, regarding the configuration, they differ in that the actuator of this embodiment has seat 20 (and piezo-electric element 10) supported through vibration film 30, and the following advantageous effects are produced due to this difference.

Specifically, vibration film 30 is more susceptible to deformation because it is made of a relatively lowly rigid material as compared with seat 20. Therefore, according to this embodiment, a larger vibration amplitude can be produced as compared with the conventional configuration in which the outer periphery of seat 20 is directly supported by supporting member 45. Also, in the configuration of this embodiment, vibration film 30 (see FIG. 4) is provided to extend in the horizontal direction (i.e., in parallel with the main surfaces of piezo-electric element 10). Consequently, it is less prone to a problem of an increase in size of the entire actuator due to the addition of vibration film 30.

Also, this embodiment employs circular piezo-electric element 10. Since an energy efficiency of circular piezo-electric element 10, when it performs a radius extending motion is high as compared with a rectangular element, this configuration can produce a larger driving force when the same voltage is applied. Then, with such a large driving force propagated to the vibration film, the amount of vibrations of the piezo-electric actuator increases. Also, in the case of the circular element, since the distance from its center to the peripheral edge is uniform, a stress generated when vibrations are propagated to a beam is uniformly distributed, advantageously resulting in a higher energy efficiency and an increased amplitude as well. Also, since piezo-electric element 10, seat 20, and vibration film 30 are concentrically arranged, uneven vibrations and the like are less susceptible to occur.

Next, a description will be given of the relationship between a vibration mode and the frequency characteristic of the piezo-electric actuator. The utilization of a piezo-electric actuator as an acoustic element per se has been disclosed in the aforementioned JP-61-168971-A, JP-2000-140759-A, JP-2001-17917-A and the like. However, the acoustic elements in these publications mean to be a buzzer and a vibrator. When used only as a vibrator, a sound pressure may simply be improved, but when used as a speaker, the vibration mode of the piezo-electric actuator must be studied in consideration of even its frequency characteristic as well.

Figure 1:
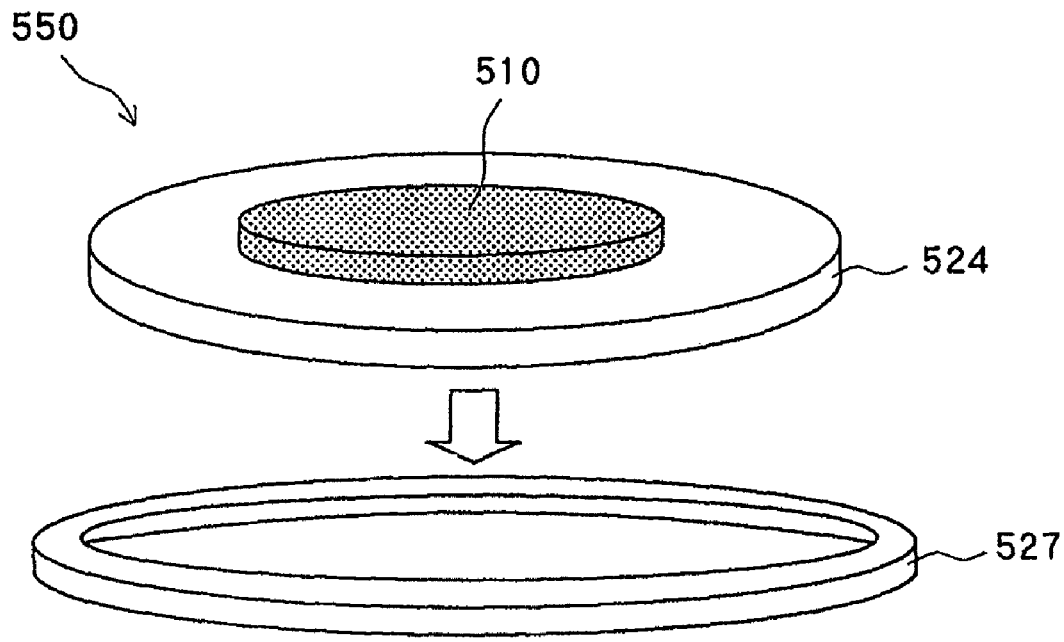
FIG. 1 A perspective view showing the configuration of a conventional piezo-electric actuator which has the outer periphery of a seat directly connected to a supporting member.
Figure 2:
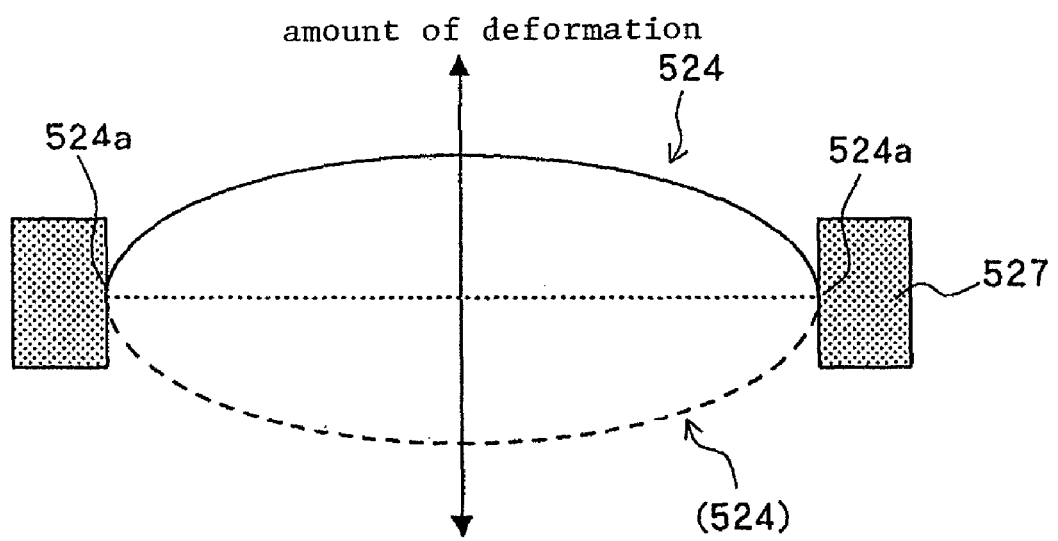
FIG. 2 A vertical sectional view schematically showing a mode of vibrations of the piezo-electric actuator of FIG. 1.
Figure 6A:
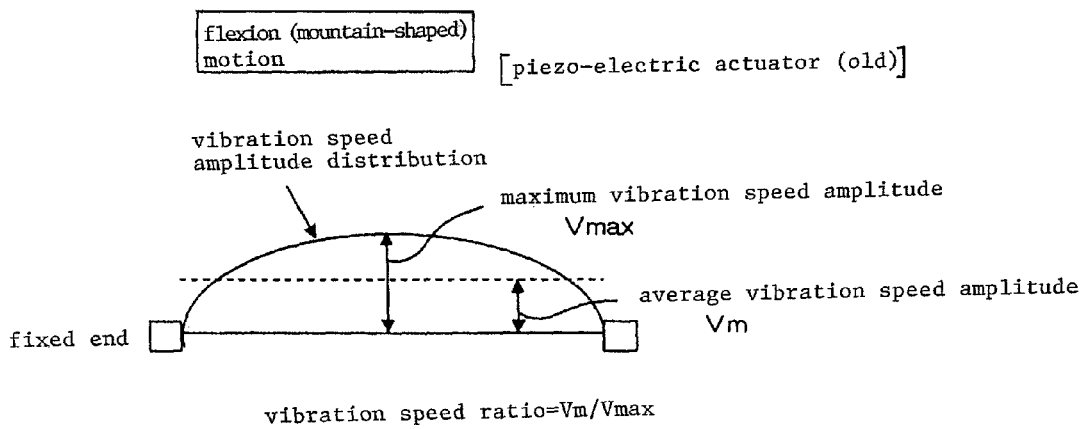
FIG. 6A A schematic diagram for describing a vibration mode of a flexion type of the piezo-electric actuator.
Figure 6B:
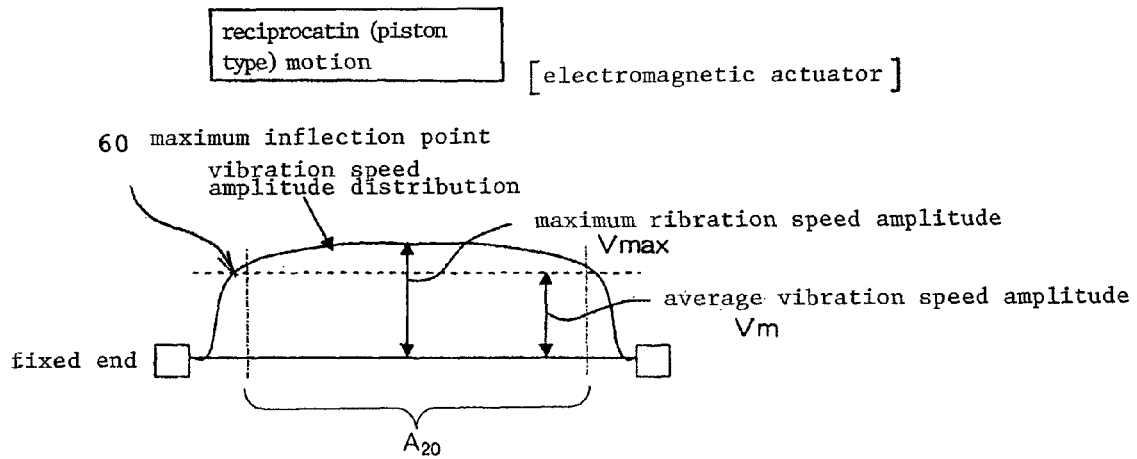
FIG. 6B A schematic diagram for describing a vibration mode of a piston type of a flexion type of the piezo-electric actuator.

FIG. 6A shows a vibration mode of a conventional piezo-electric actuator as shown in FIGS. 1 and 2, and FIG. 6B shows a vibration mode of an electromagnetic actuator (see, for example, FIG. 35 later described). As shown in FIG. 6A, the conventional piezo-electric actuator presents a flexion type vibration mode in which the amplitude at the center reaches a maximum. On the other hand, the electromagnetic actuator presents a piston type vibration mode in which a central region, labeled A20 as an example, maintains a substantially flat state, and this central region A20 reciprocally moves in the vertical direction as shown in the figure. For improving the frequency characteristic as an acoustic element, it is known that the vibration mode is preferably brought as close as possible to the piston type.

Next, a description will be given of features of flexion type motions and piston type motions. A vibration mode of flexion type motions generated by the conventional piezo-electric actuator presents a mountain shape in which the center of the piezo-electric ceramics matches a maximum displacement inflection point. While a large amplitude can be produced at the center, displacements relatively attenuate gradually at positions closer to the vicinity of the fixed end. On the other hand, a vibration mode of piston motions presents a trapezoidal shape having maximum inflection point 60 near the fixed end, as shown in FIG. 6B, and features in that vibrations largely rises near the fixed end. In comparison of vibration displacement amounts in these two vibration modes, the flexion type motions are superior to the piston type motions in the amount of maximum vibrations within a sound radiation plane, whereas the piston type motions are superior to the flexion type motions in the amount of average vibrations within the sound radiation plane, with a large amount of displacement at the fixed end.

In this regard, since the sound pressure is usually defined by a volumetric displacement to a radiation plane, the sound pressure is higher as the average vibration amount is larger, so that the piston type vibration mode is preferably promoted for improving the sound pressure level. In this regard, the piston type motion and flexion type motion can be defined by the proportion of the average displacement amount to the maximum displacement amount, where the piston type mode is promoted as the proportion approaches to one in an equation expressed by (average vibration amount)/(maximum vibration amount) (described in detail in Evaluation of Embodiment 5).

According to the configuration of this embodiment, as shown in FIG. 4, the area to which seat 20 is adhered is an area corresponding to A20, and the outside thereof is a connection area A30 which is apparently less rigid (i.e., more susceptible to deformation) than area A20. Accordingly, since this connection area A30 presents relatively larger deformations, the vibration mode can be brought closer to the piston type as a whole. Further, the fact that area A30 around the area to which the seat is adhered is made of a less rigid material means that the resonant frequency of a vibration plate (which refers to a laminate of the seat and vibration film) becomes lower as compared with the conventional configuration in which seat 20 is directly connected to the supporting member. Then, a lower resonant frequency leads to improvements in the frequency characteristic of the acoustic element, as described below.

In an acoustic element, it is usually regarded relatively difficult to generate sufficiently large sound at frequency equal to or lower than resonant frequency f0, and for this reason, configurations are often employed to utilize only a frequency band after resonant frequency f0 as reproducible sound. Specifically, when resonant frequency f0 of a piezo-electric actuator exists in a high frequency band (for example, 2 kHz), stating extremely simply, the acoustic element can generate sound only in a band equal to or higher than 2 kHz.

On the other hand, a frequency band required to reproduce music by a portable telephone or the like is preferably from 1 k to 10 kHz. Thus, a piezo-electric actuator having resonant frequency f0 at 1 kHz or lower is suitable for portable telephones and the like, and an actuator which is also advantageous in a reduction in size, like this embodiment, has a high utility value. However, since the piezo-electric actuator uses highly rigid ceramic as a piezo-electric element, the resonant frequency of a vibration section becomes higher, and the piezo-electric actuator has a nature of being unsuitable for generating low sound. In this regard, it is contemplated to increase the element size, thereby reducing apparent rigidity of the piezo-electric element to lower the resonant frequency. However, as previously described, since the piezo-electric actuators are often equipped in small electronic devices such as portable telephones, by way of example, it is preferable to configure to facilitate the generation of low sound without changing the element size from a viewpoint of preventing an increase in the size of the device as well.

Summarizing the foregoing, in order to reproduce music in a wider frequency band in a portable telephone or the like, it can be said that it is important to set resonant frequency f0 of the piezo-electric actuator at a point lower than resonant frequency f0. Then, in order to more lower resonant frequency f0, it is effective to reduce the rigidity of the vibration plate.

According to the configuration of this embodiment, since the member for connecting seat 20 to supporting member 45 is vibration film 30 which is less rigid than the seat, the resonant frequency is reduced as compared with the conventional configuration. As a result, the piezo-electric actuator of this embodiment can produce a sufficient vibration amplitude over a wide frequency range, and can realize a good frequency characteristic when it is used as an acoustic element.

Other than the above, the piezo-electric actuator of this embodiment has the following advantages. First, the vibration characteristic of the piezo-electric actuator can be readily adjusted by changing the material characteristic and shape of seat 20, and the material characteristic and shape of vibration film 30 as appropriate. Particularly, since the shape of the seat and the thickness of the vibration film can be adjusted without changing the size of a housing (size of the supporting member), the supporting member can be used as a common part, which is advantageous in reducing the manufacturing cost as well.

Also, conventionally, a reduction in the resonant frequency of a piezo-electric actuator has been supported by making a piezo-electric element thinner, whereas, according to the present invention, the resonant frequency can be reduced simply by adjusting the material of the vibration film, and the spacing between the supporting member and the restraining member even if a relatively thick piezo-electric element is used. Generally, for manufacturing a thin piezo-electric element, a cost is relatively increased due to cracking during sintering and the like. On the other hand, according to the present invention, the manufacturing cost can be limited because such a thin piezo-electric element need not be provided.

The piezo-electric actuator according to the present invention can also be utilized as a sound source of an electronic device (for example, a portable telephone, a notebook type personal computer, a small gaming device or the like). Incidentally, conventionally, a piezo-electric actuator which uses ceramics as a piezo-electric element has an aspect that the piezo-electric element is highly susceptible to damages when it is dropped. On the other hand, the portable electronic device as mentioned above is often dropped by the user by mistake during use, and from this fact, the piezo-electric actuator has been conventionally considered to be unsuitable for portable devices. However, in the piezo-electric actuator of the present invention, since seat 20 to which the piezo-electric element is fixed and supporting member 45 are supported through lowly rigid vibration film 30, an impact can be absorbed by an attenuation effect of vibration film 30, even if the piezo-electric actuator is dropped, thus making the piezo-electric element less susceptible to damages. Accordingly, the piezo-electric actuator can be suitably used for portable electronic devices.

Second Embodiment

Figure 7:
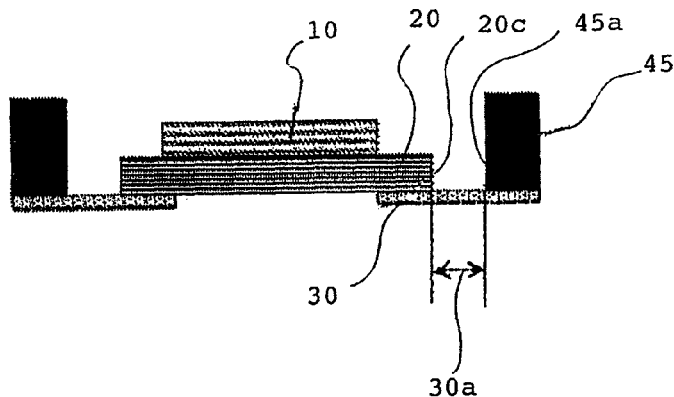
FIG. 7 A schematic diagram showing the configuration of a piezo-electric actuator of a second embodiment.

In the piezo-electric actuator of the present invention, a flection amount δ (m) of vibration film intervening section A between the outer periphery of the seat and the inner periphery of the supporting member can be calculated in the following manner. In this regard, vibration film intervening section A between the outer periphery of the seat and the inner periphery of the supporting member, i.e., vibration film intervening section A (30a) is an intervening site comprised of the vibration film positioned between outer periphery 20c of seat 20 and inter periphery 45a of supporting member 45, as shown in FIG. 7, and flection amount δ (m) of this vibration film intervening section A is calculated from the following calculation equation (1).

Figure 8:
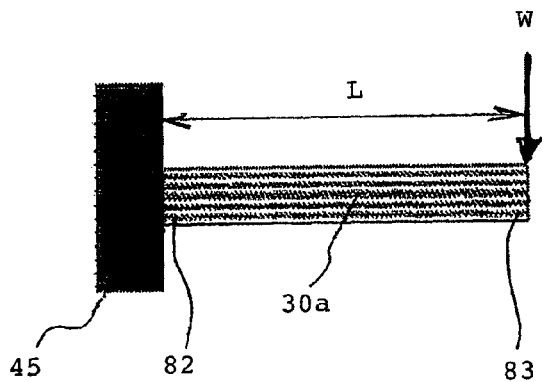
FIG. 8 A schematic diagram showing a vibration film intervening section in a cantilever structure.

A description will be given of a method of calculating flection amount δ of vibration film intervening section A in the present invention. Calculation equation (1) described below is an equation applied to vibration film intervening section A which is in a cantilevered structure, as shown in FIG. 8. Here, the cantilevered structure is a structure in which one end of vibration film intervening section A is coupled to supporting member 45 to form fixed end 82, while the other end is free end 83, as shown in FIG. 8. Then, by applying defined load W to a leading end of this free end 83, flection amount δ can be calculated.

Figure 9:
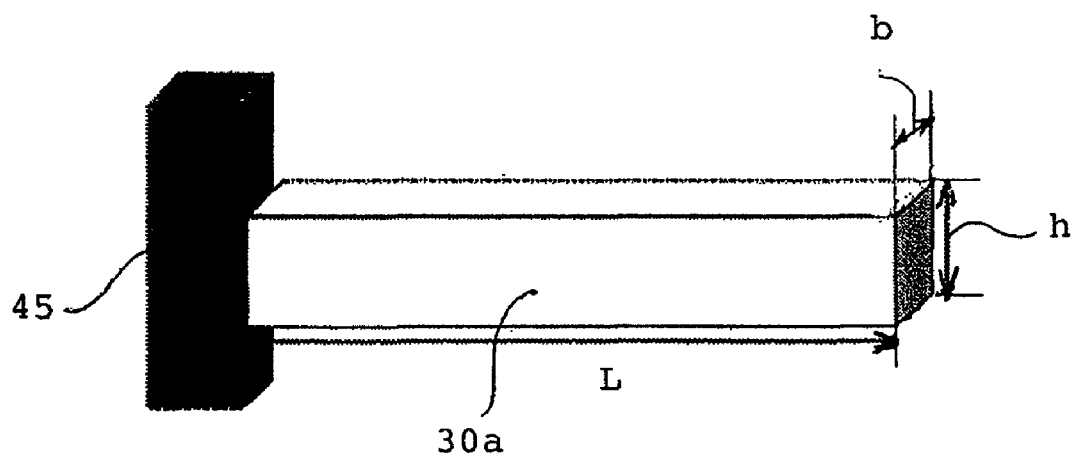
FIG. 9 A schematic diagram showing a vibration film intervening section in a cantilever structure.

Also, in calculation equation (1), L is the length of vibration film intervening section A to the radial direction of piezo-electric element 10; h is the thickness of the vibration film; and E is modulus of direct elasticity of the material of the vibration film (see FIG. 9). Then, in this embodiment, load W was chosen to be 1 N (N/m$^2$), and width b of beam-shaped vibration film intervening section A to be 0.001 m for making the calculation.

In this regard, the calculation of flection amount δ of vibration film intervening section A in the shape of the piezo-electric actuator of the present invention is essentially made in consideration of an annular plane shape which has an opening, as described later with reference to FIGS. 11A and 11B, but in calculation equation (1), flection amount δ was calculated on the assumption that changes in the thickness, the modulus of direct elasticity of the material of the vibration film, and length L of vibration film intervening section A exponentially exerted influences, while the influence due to a plane area was small, so that an approximation could be made even when a plane shape was a rectangular shape, and a rectangular shape with width b equal to 0.001 (m) was employed in this embodiment.

$$\delta = (W \cdot L^3)/(3 \cdot E \cdot I) \qquad \text{(Equation 1)}$$

L: length (m) of the vibration film intervening section between the outer periphery of the seat and the inner periphery of the supporting member;

E: modulus of direct elasticity (N/m²) of the material of the vibration film;

W: load (N);

I: moment of inertia (m⁴);

$$I=(b \cdot h^3)/12 \qquad \text{(Equation 2)},$$

b: width (m) of the vibration film intervening section=0.001; and h: thickness (m) of the vibration film.

Figure 10:
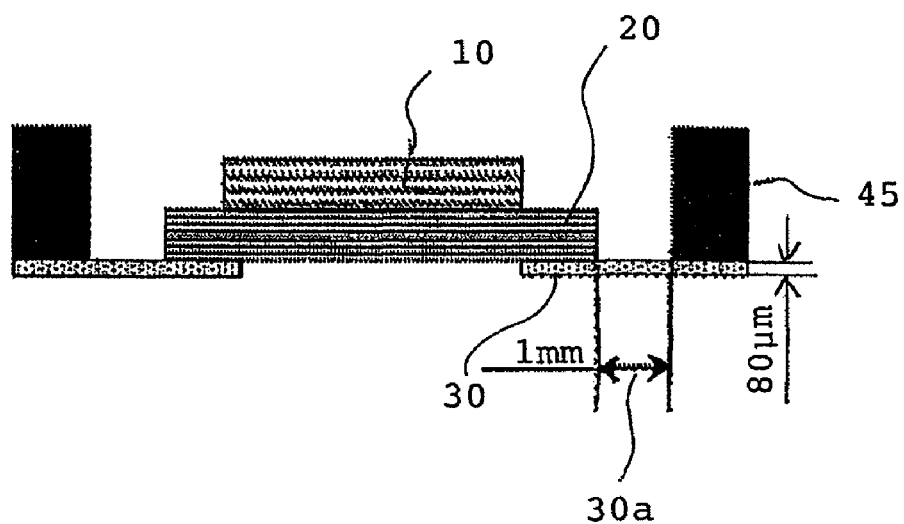
FIG. 10 A schematic diagram showing a piezo-electric actuator for calculating a deflection amount of the vibration film intervening section.

In the following, flection amount δ of vibration film intervening section A is calculated in the shape shown in FIG. 10, as an example. Substituting 0.001 m (1 mm) into length L of vibration film intervening section A; $4.0 \times 10^8$ (N/m²) into the modulus of direct elasticity of the vibration film (material: urethane); $8 \times 10^{-5}$ (m) (80 μm) into thickness h of the vibration film; 0.001 m (1 mm) into width b which is a defined value; and 1 (N) into load W which is a defined value, respectively, flection amount δ is calculated to be 0.0195 (m).

In the piezo-electric actuator of this embodiment, by making a selection such that flection amount δ (m) falls within a range of 0.001 to 5, a piston type vibration mode can be achieved. By making an adjustment such that flection amount δ of vibration film intervening section A, which is a node of vibrations, falls within a predetermined range, a stress concentrates on a joint (20c) of the outer periphery of a spring and the vibration film or a spring seat (20), when vibrations occur, resulting in a maximum inflection point position (see FIG. 6B).

Since the maximum inflection point is formed near the fixed end in this way, the piston type vibration mode is promoted. On the other hand, when flection amount □ is smaller than 0.001, a stress concentrates on the outer periphery of supporting member 45 and the center of the piezo-electric ceramics, the maximum inflection point exists at the center of the ceramics, resulting in a flexion type vibration mode. On the other hand, when flection amount δ is larger than five, a stress concentrates on the periphery of seat 20 when vibrations occur, but since the rigidity of the vibration film is low, the generated amount propagated to the vibration film attenuates, a sufficient vibration displacement cannot be produced, and its vibration mode is a free end type flexion motion which presents flexion motions only near the piezo-electric ceramic.

As described above, by adjusting flection amount δ of vibration film intervening section A to fall within a predetermined range, the piston type motion mode is promoted. As compared with a conventional piezo-electric actuator having a mountain-shaped motion mode, an average vibration amount is high within a sound radiation plane, and therefore a sound pressure level is high, so that it is possible to realize as a piezo-electric actuator for an acoustic element.

Third Embodiment

Figure 11A:
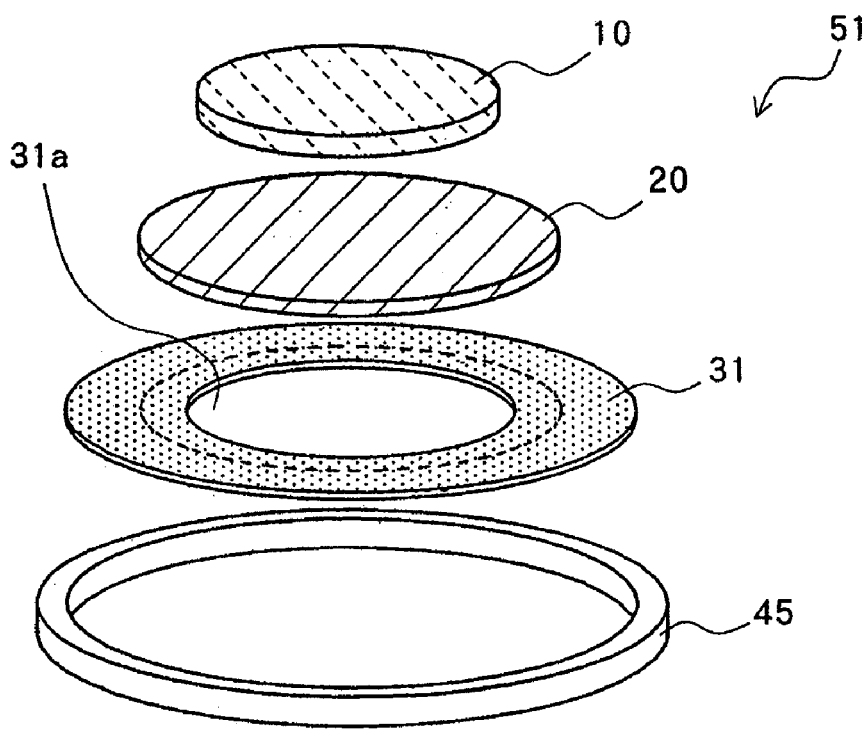
FIG. 11A An exploded perspective view showing the configuration of a piezo-electric actuator of a third embodiment.
Figure 11B:
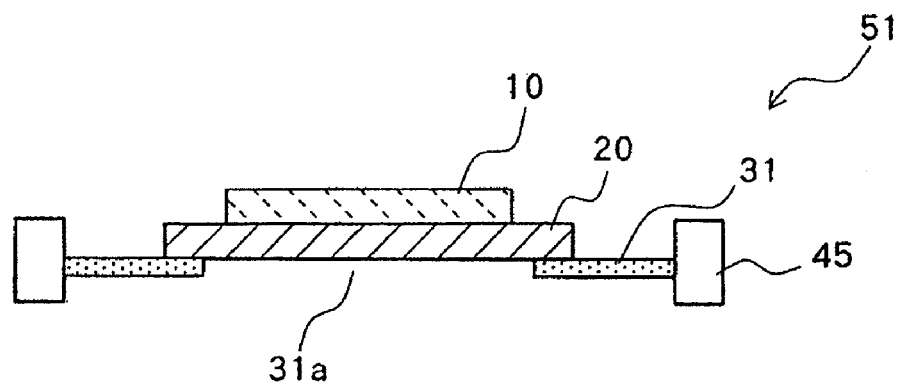
FIG. 11B A vertical sectional view showing the configuration of the piezo-electric actuator of the third embodiment.

The piezo-electric actuator of the present invention is not limited to those shown in the foregoing embodiments, but may have a configuration as shown in FIGS. 11A, 11B. FIG. 11A is an exploded perspective view showing the configuration of a piezo-electric actuator of a second embodiment, and FIG. 11B is a vertical sectional view of the piezo-electric actuator.

Piezo-electric actuator 51 of FIGS. 11A and 11B employs vibration film 31 which is formed with opening 31a at the center thereof. The rest of the configuration is similar to the first embodiment. Opening 31a is circular, and is formed to be concentric with piezo-electric element 10 and seat 20. Since opening 31a is formed, seat 20 is supported only around the outer periphery of its back surface (bottom surface as shown in the figure) by vibration film 31. Stated another way, the back surface of seat 20 has an area corresponding to opening 31a in an exposed state.

Even piezo-electric actuator 51 of this embodiment configured as described above perform vibration operations in a manner similar to the aforementioned embodiments using piezo-electric element 10 as a driving source. Here, seat 20 is configured to be supported only around the outer periphery thereof, and the area of opening 31a is not restrained by vibration film 31, so that seat 20 is more prone to flexion and deformation, resulting in a further increase in the vibration amplitude of the actuator. Also, the fact that an apparent rigidity of the vibration plate (which refers to a laminate of the seat and vibration film) becomes lower in this way means that the resonant frequency of the actuator becomes lower, which is preferable because the frequency characteristic of the acoustic element is improved.

In view of advantageous effects produced by opening 31a as described above, it can be said that as the area of opening 31a is larger, seat 20 is more prone to flexion and deformation, leading to a lower resonant frequency of the actuator. In this regard, the shape of opening 31a is not limited to the circular shape but may be a rectangular or a polygonal shape. Also, instead of a single opening as in the foregoing embodiment, a plurality of openings may be provided.

Fourth Embodiment

Figure 12:
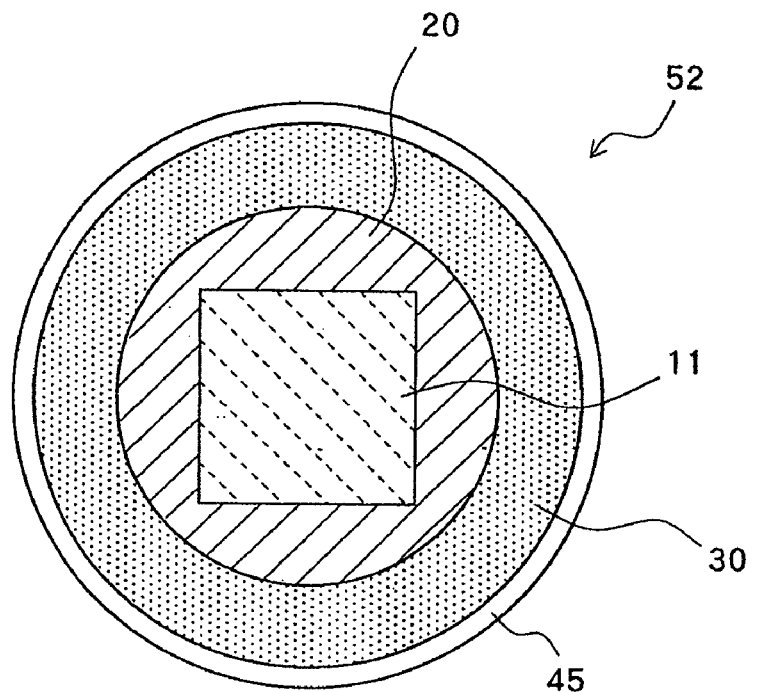
FIG. 12 A plan view showing the configuration of a piezo-electric actuator of a fourth embodiment.

The actuator of the present invention is not limited to those shown in the aforementioned embodiment, but may have a configuration as shown in FIG. 12. Piezo-electric actuator 52 shown in FIG. 12 employs piezo-electric element 11 formed in a square shape. The rest of the configuration is similar to the first embodiment. Piezo-electric element 11 is modified only in the contour shape of piezo-electric element 10 in the first embodiment, and its material and basic structure are similar to the first embodiment. For example, piezo-electric element 11 is similar to the aforementioned embodiment in that an upper electrode layer and a lower electrode layer are formed on the top and bottom surfaces of a piezo-electric plate, respectively.

In this way, in the present invention, the piezo-electric element is not particularly limited in the contour shape, and may be circular (see FIG. 3) or rectangular (see FIG. 12). Further, the piezo-electric element may be oval or polygonal. Particularly, a square element is highly symmetric, like a circular piezo-electric element, and therefore provides a high energy efficiency when it performs expansion/contraction motions (radially expanding motions), so that a larger driving force can be produced as compared with a rectangular element. Then, with such a large driving force, a sufficient vibration amplitude can be produced. Also, the rectangular element is advantageous in view of the manufacturing cost because it presents a higher yield rate and is easier to fabricate, as compared with a circular element.

Fifth Embodiment

Figure 13:
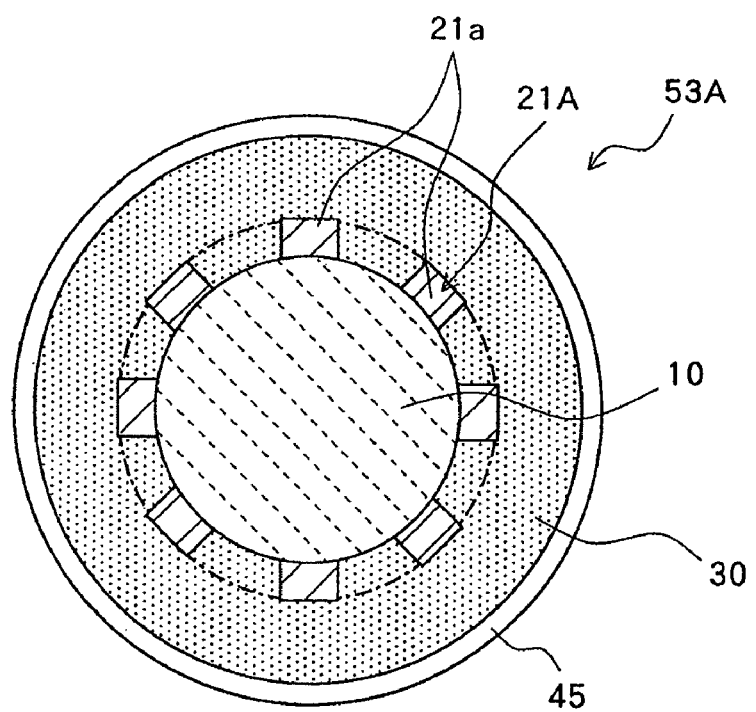
FIG. 13 A plan view showing the configuration of a piezo-electric actuator of a fifth embodiment.
Figure 14:
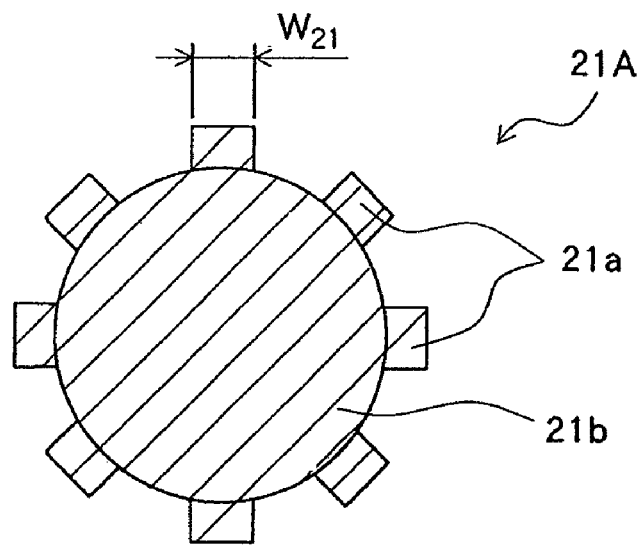
FIG. 14 A plan view showing a seat piece for use in the piezo-electric actuator of FIG. 13.

The piezo-electric actuator of the present invention is not limited to those shown in the aforementioned embodiments, but may further have a configuration as shown in FIGS. 13 and 14. FIG. 13 is a plan view showing the configuration of a piezo-electric actuator of a fourth embodiment, and FIG. 14 is a plan view showing a seat piece for use in the piezo-electric actuator.

As shown in FIGS. 13 and 14, in piezo-electric actuator 53A, a plurality of beams 21a are formed on the outer peripheral side of seat 21A. The rest of the configuration is similar to the first embodiment. A plurality of beams 21a are formed along the outer periphery edge of body section 21b which has a circular contour. All beams 21a are in the same shape, and radially extend from the center of body section 21b outward in the radial direction.

Seat 21A is a single member which has body section 21b integrated with beams 21a. Though the illustration is omitted, beams 21a extend straightly within the same plane as body section 21b. The material of seat 21A is the same as that of the first embodiment, and the contour shape of body section 21b is the same as the contour shape of piezo-electric element 10. A lower electrode layer of piezo-electric element 10 is bonded on the top surface of body section 21b, whereby piezo-electric element 10 is restrained by seat 21A.

Figure 15:
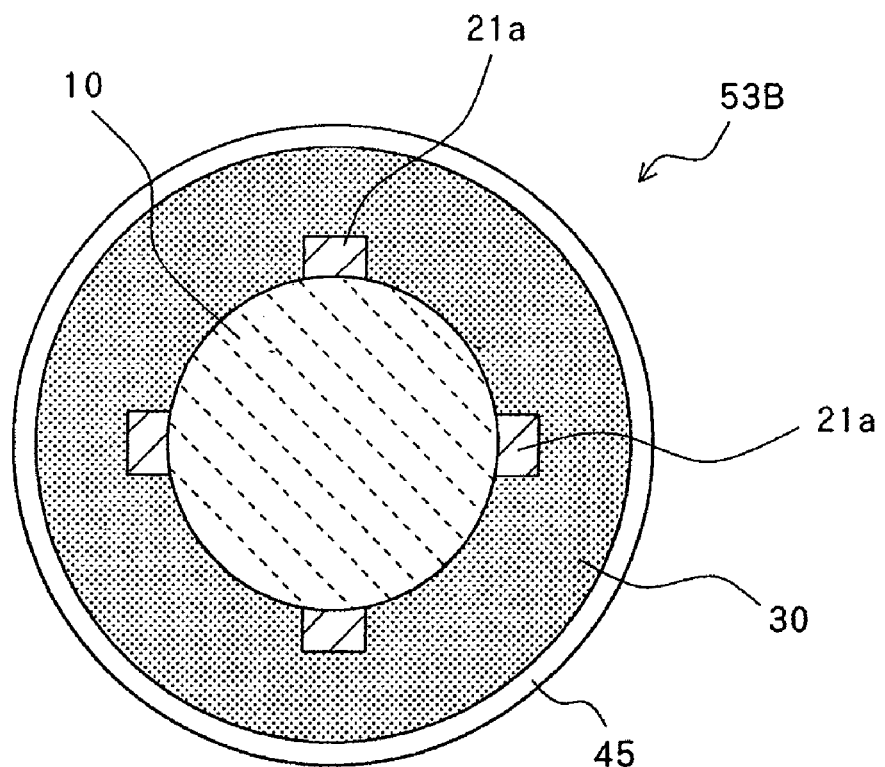
FIG. 15 A plan view showing another exemplary configuration of the piezo-electric actuator of the fifth embodiment.
Figure 16:
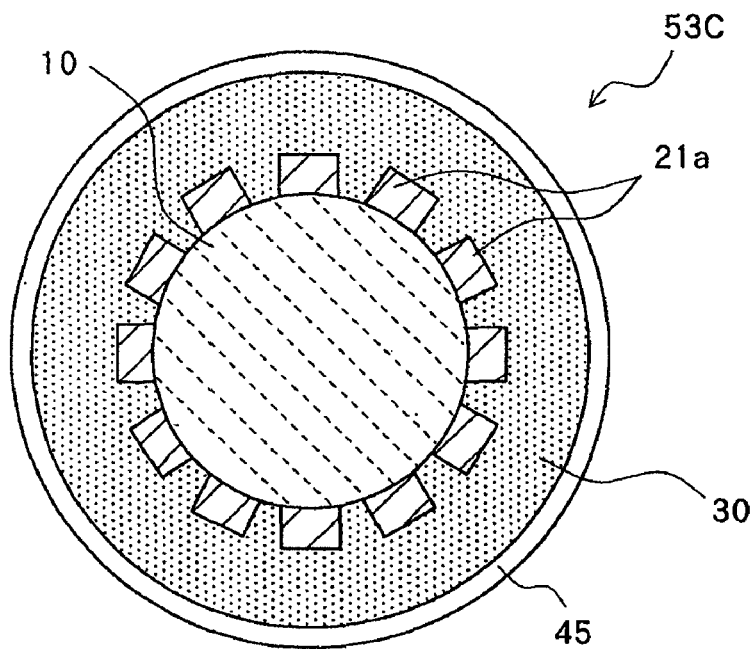
FIG. 16 A plan view showing a yet further exemplary configuration of the piezo-electric actuator of the fifth embodiment.

The number of beams 21a is not particularly limited. Piezo-electric actuator 53B shown in FIG. 15 is formed with four beams 21a, while actuator 53C shown in FIG. 16 is formed with 12 beams 21a. In any of piezo-electric actuators 53A-53C, beams 21a are formed at equal intervals (which is intended to define the same spacing between the beams with respect to the circumferential direction). Also, each beam 21a may have constant beam width W21, as shown in FIG. 14 and the like, or may be tapered such that beam width W21 becomes gradually smaller toward the leading end of the beam.

FIGS. 13 and 14 are referred to again. Seat 21A formed with beams 21a as described above is bonded on the surface of vibration film 30 through an adhesive in a manner similar to the first embodiment. In this state, the leading ends of beams 21a do not come into contact with the inner periphery of supporting member 45 (in other words, a predetermined spacing is defined between the leading ends of beams 21a and the inner periphery of the supporting member).

Even piezo-electric actuators 53A-53C comprising beams 21a as described above are similar to the first embodiment in their operation principle. Specifically, piezo-electric element 10 performs expansion/contraction motions as an AC electric field is applied to the upper electrode layer and lower electrode layer of piezo-electric element 10. In accordance with the direction of the electric field, the expansion/contraction motions by piezo-electric element 10 are alternately repeated to excite vibrations due to a restraining effect of seat 21A. In this event, body section 21b vibrates in the vertical direction, and its motions are transmitted to a plurality of beams 21a. Since beams 21a do not have their leading ends directly connected to supporting member 45 but is connected thereto through vibration film 30, an amplitude increasing effect by vibration film 30 is expected as is the case with the first embodiment.

Particularly, in a region near beam 21a, an apparent rigidity of seat 21A is reduced as compared with the seat which is not formed with a beam, which has an outer diameter defined by a circle indicated by broken line 21b'. Accordingly, the outer periphery of the seat is more susceptible to deformation, and vibrations of the vibration film can be more induced, so that the vibration amplitude of the piezo-electric actuator is more increased. In the actuator of this embodiment, since deformations of the beams are relatively large, while deformations of the piezo-electric body supporting section are relatively small, the piston type vibration mode is more likely to occur as shown in FIG. 6B rather than the vibration mode as shown in FIG. 6A. For this reason, the piezo-electric element can be largely reciprocally moved in the vertical direction without giving large deformations or distortions to the piezo-electric body.

Alternatively, in the configuration described above, beams 21a and body section 21b can be provided as separate members, and further, these two members 21a, 21b may be of the same material or of different materials. Also, when seat 21A is formed from a single sheet-shaped member, it may be stamped out by pressing.

Sixth Embodiment

Figure 17:
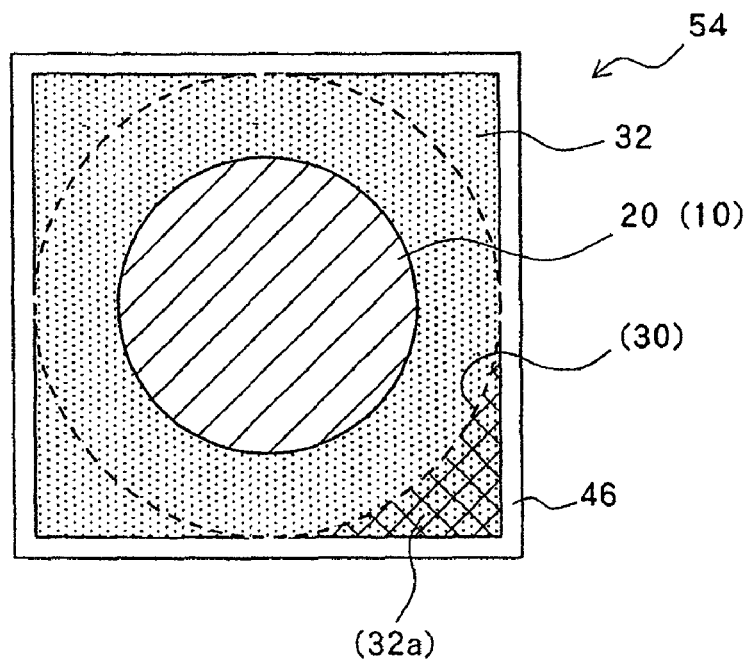
FIG. 17 A plan view showing the configuration of a piezo-electric actuator of a sixth embodiment.

Further, the piezo-electric actuator of the present invention is not limited to those shown in the aforementioned embodiments, but may have a configuration as shown in FIG. 17. In this regard, FIG. 17 omits the illustration of piezo-electric element 10. Piezo-electric actuator 54 shown in FIG. 17 employs square supporting member 46, and accordingly, vibration film 32 also has a rectangular contour shape. The rest of the configuration is similar to the first embodiment.

Even if vibration film 32 is rectangular in this way, the advantageous effects of the present invention resulting from seat 20 connected to supporting member 46 through vibration film 32 can be produced in a similar manner to the foregoing. With the use of rectangular vibration film 32, an area for disposing the piezo-electric actuator can be effectively utilized for the following reasons. For example, consider circular vibration film 30 as indicated by a broken line in FIG. 17 and vibration film 32 of this embodiment. The sizes of vibration films 30, 32 are in a relationship that the contour of vibration film 30 is inscribed in the contour of vibration film 32.

When a piezo-electric actuator is placed in an electronic device or the like, a rectangular area is often provided in general as a placement space in the electronic device. In this event, a placement space required in the electronic device is substantially the same whether a circularly contoured actuator having vibration film 30 is utilized or a rectangularly contoured actuator having vibration film 32 is utilized.

In view of this point, of the two piezo-electric actuators which use the same placement space, piezo-electric actuator 54 of this embodiment which can increase the area of vibration film 32 is more advantageous in that it can realize a higher sound pressure level. In this regard, when rectangular vibration film 32 is compared with circular vibration film 30, vibration film 32 has a wider area of the vibration film by four areas 32a indicated by shading, and an improved sound pressure level is expected in correspondence to this increase.

Seventh Embodiment

Figure 18:
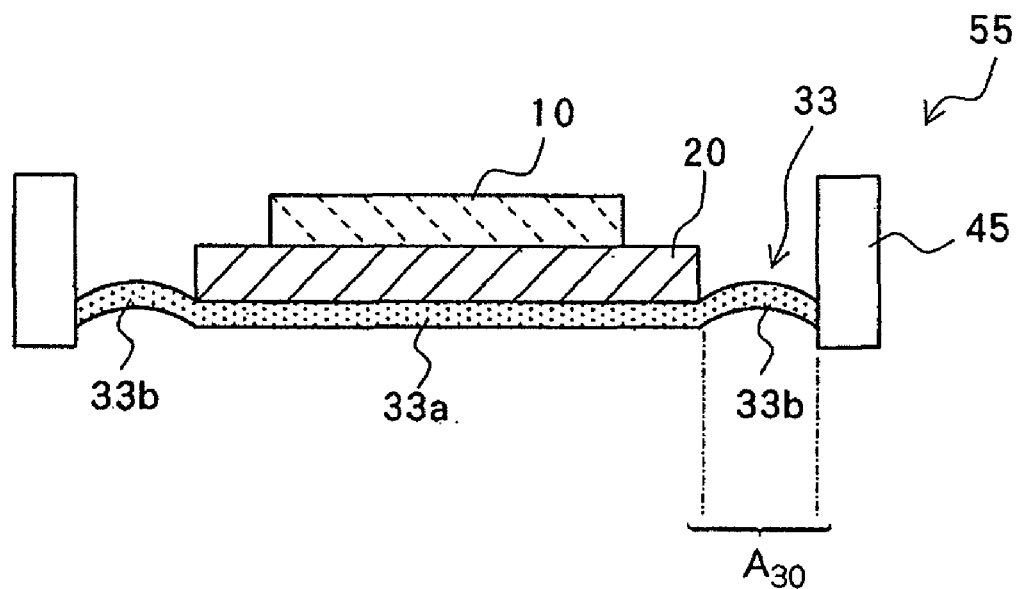
FIG. 18 A vertical sectional view showing the configuration of a piezo-electric actuator of a seventh embodiment.

The piezo-electric actuator of the present invention is not limited to those shown in the aforementioned embodiments, but may have a configuration as shown in FIG. 18. Piezo-electric actuator 55 shown in FIG. 18 employs vibration film 33 including a curved section 33b. The rest of the configuration is similar to the first embodiment.

Vibration film 33 comprises flat central section 33a for supporting the back surface of seat 20, and curved section 33b formed outside of central section 33a. Though the illustration is omitted, the contour shape of central section 33a, when viewed from above, is circular, while the contour shape of curved section 33b is annular, concentric with central section 33a.

With curved section 33b formed in this way, the stroke of the vibration film in connection area A30 is increased, thereby reducing the rigidity of the vibration film. As a result, the vibration film is more susceptible to deformation, the resonant frequency is reduced, and a larger vibration amplitude can be produced.

The above-mentioned "curved section" is intended to be a structure with part of the vibration film which is three-dimensionally curved. Accordingly, the "curved section" includes, for example, a cross-sectional structure in which waveforms continue, in addition to semi-circular curved section 33b in cross-section as shown in FIG. 18.

While the third to sixth embodiments have employed vibration films 30, 32, 33 which are not formed with an opening, this is not a limitation. For example, vibration film 32, 33 (see FIG. 17, 18) may be formed with an opening, as described in the second embodiment. Also, components of each embodiment (including a seventh embodiment below) may be combined with one another as appropriate, as a matter of course.

Eighth Embodiment

While the foregoing description has been given of an exemplary configuration in which piezo-electric element 10 is fixed on one surface of the seat, the piezo-electric actuator of the present invention is not so limited. The piezo-electric actuator of the present invention may be equipped with bimorph type piezo-electric element 11, as shown in FIG. 19.

Bimorph type piezo-electric element 11 comprises piezo-electric element 11A and piezo-electric element 11B adhered on both surfaces of seat 20 similar to that of the first embodiment, respectively. Piezo-electric element 11 thus configured alternates such operations as one piezo-electric element 11A expands while the other piezo-electric element 11B contracts, and the other piezo-electric element 11B expands while the one piezo-electric element contracts. According to such a configuration, a larger driving force can be produced as compared with a one-sheet type piezo-electric element as described above.

In bimorph type piezo-electric element 11, when one of piezo-electric element 11A, 11B expands while the other contracts (in other words, when it is comprised of two elements which perform reverse operations to each other), the polarization direction of each piezo-electric element is not particularly limited. For example, the polarization directions of both the piezo-electric elements may be arranged in the same direction (for example, upward as shown in the figure).

Figure 19:
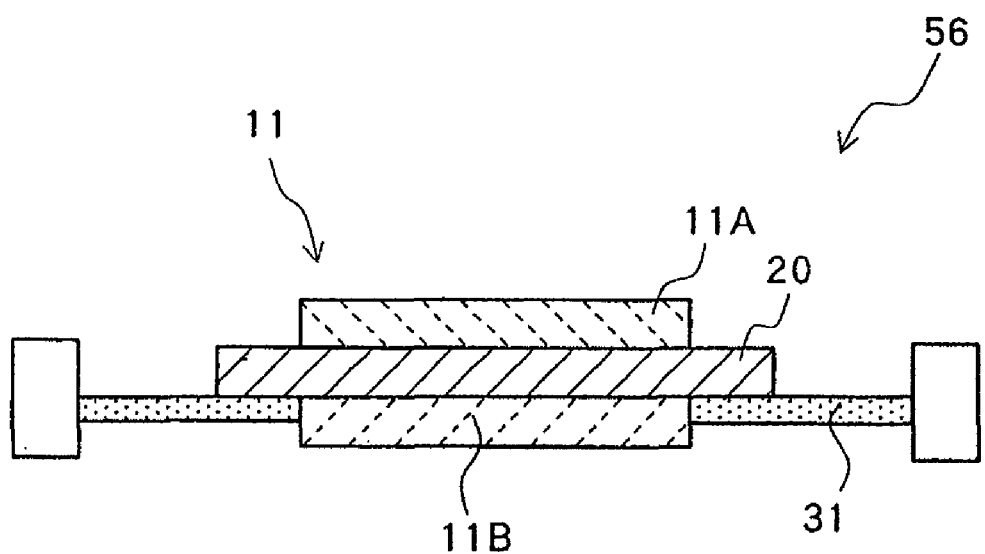
FIG. 19 A vertical sectional view showing the configuration of a piezo-electric actuator of an eighth embodiment.

In this regard, when a bimorph type element is unitized, vibration film 31' formed with an opening may be employed, as shown in FIG. 19. Alternatively, vibration film 30 without an opening may be employed, where piezo-electric element 11B may be adhered on the opposite side to piezo-electric element 11A with the vibration film interposed therebetween (see [Example 5] later described).

Figure 20:
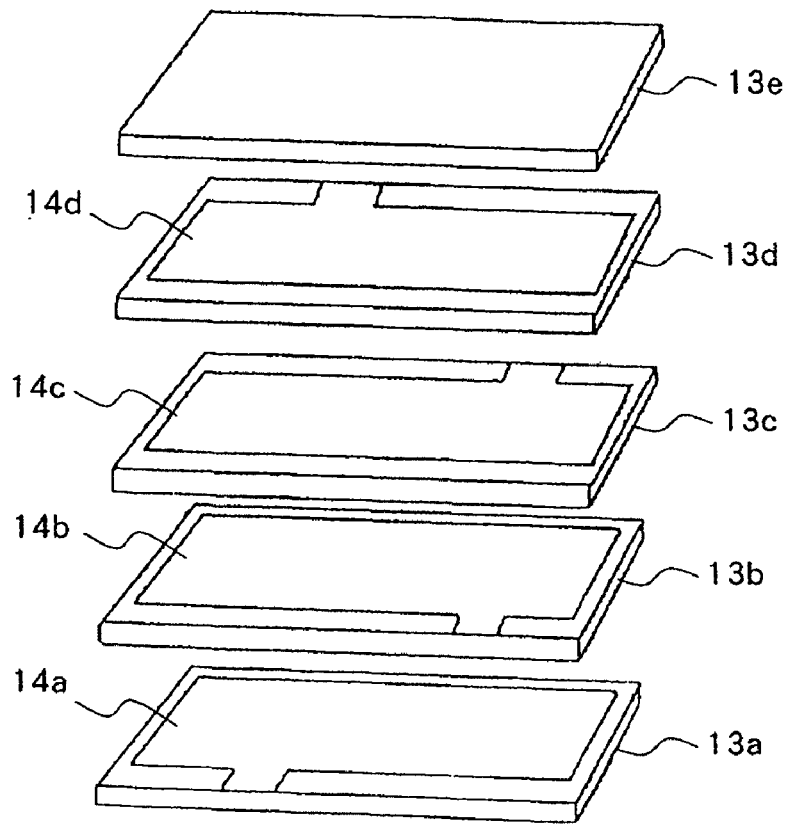
FIG. 20 An exploded perspective view for describing a multi-layered piezo-electric element which can be utilized instead of a single-layer piezo-electric element.

Further describing the piezo-electric element, the piezo-electric element may be in a laminate structure per se. This is described with reference to FIG. 20. Piezo-electric element 12 shown in FIG. 20 is in a multi-layered structure which comprises piezo-electric plates 13a-13e, made of a piezo-electric material, laminated in five layers. Electrode layers (conductive layers) 14a-14d are formed one between the piezo-electric plates. The polarization direction of each piezo-electric plate 13a-13e is opposite to one another, and the orientation of electric field is also configured to be alternately opposite. According to piezo-electric element 12 in such a laminate structure, since a high electric field strength is generated between the electrode layers, a driving force of the overall piezo-electric element is improved by the number of laminated piezo-electric plates. Piezo-electric element 12 shown in FIG. 20 can be utilized, for example, instead of piezo-electric element 10 shown in FIG. 3.

EXAMPLES

Figure 21:
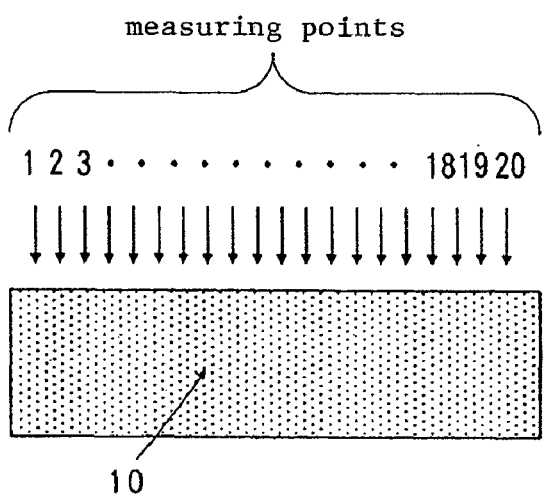
FIG. 21 A diagram for describing a measurement point of an average vibration speed amplitude.

Characteristic evaluations of the piezo-electric actuator of the present invention were made with the following Examples and Comparative Examples 1-4 to evaluate the effects of the present invention. Evaluated items are shown below.
(Evaluation 1) Measurement of Resonant Frequency: Resonant frequency was measured when an AC voltage of 1 V was applied.
(Evaluation 2) Maximum vibration speed amplitude: Maximum vibration speed amplitude Vmax (see FIGS. 6A, 6B) was measured when an AC voltage of 1 V was applied during resonance.
(Evaluation 3) Average vibration speed amplitude: Vibration speed amplitudes were measured at 20 measuring points uniformly distributed in the longitudinal direction of the piezo-electric elements, as shown in FIG. 21, and an average value of these were calculated.
(Evaluation 4) Calculation of flection amount δ of the vibration film intervening section. Flection amount δ was calculated from the following equation. In the following equation, the calculation is made with a load chosen to be 1 N (N/m²) and width b to be 0.001 m (Equation 2) (see the second embodiment for details of the calculation method).

$$\delta = (W \cdot L^3)/(3 \cdot E \cdot I) \quad \text{(Equation 1)}$$

L: Length (m) of Vibration Film Intervening Section between Outer Periphery of Seat and Inner Periphery of Supporting Member
E: Modulus of Direct Elasticity of Material of Vibration film (N/m²)
W: Load (N)
I: Moment of Inertia (m⁴)
Moment of Inertia (I)

$$I = (b \cdot h^3)/12 \quad \text{(Equation 2)}$$

b: Width (m) of Vibration Film Intervening Section=0.001
h: Thickness (m) of Vibration Film
(Evaluation 5) Vibration Mode: As shown in FIGS. 6A and 6B, a "vibration speed ratio" is defined by average vibration speed amplitude Vm divided by maximum speed amplitude Vmax, and the vibration mode was discriminated on the basis of the value of this vibration speed ratio. Specifically, from the fact that an flexion motion (mountain-shaped motion) results as shown in FIG. 6A when the vibration speed ratio is small, whereas a reciprocation (piston type motion) results as shown in FIG. 6B when the vibration speed ratio is large, a threshold was set to vibration speed ratio=0.8 in this example, where an flexion motion was discriminated when the vibration speed ratio was smaller than 0.8, while a piston type motion was discriminated when equal to or larger than 0.8.
(Evaluation 6) Measurement of Sound Pressure Level: A sound pressure level was measured by a microphone disposed at a position a predetermined distance away from the element when an AC voltage of 1 V was applied. This predetermined distance is 10 cm unless otherwise noted.
(Evaluation 7) Drop and Impact Test: A portable telephone equipped with the piezo-electric actuator was naturally dropped five times vertically from above 50 cm to make a drop impact stability test. Specifically, destructions such as crack and the like were visually confirmed after the drop and impact test, and a sound pressure characteristic was further measured after the test. As a result, a sound pressure level difference (which refers to the difference between the sound pressure level before the test and the sound pressure level after the test) equal to or less than 3 dB was qualified (○), and that equal to or more than 3 dB was disqualified (X).

In this regard, the structure (shape, material and the like) of the piezo-electric actuator according to each example described below, and results of the evaluations are shown in Table 1 and Table 2.

TABLE 1

|  | EXAMPLE 1 (BASIC MODEL) | EXAMPLE 2 (BORED) | EXAMPLE 3 (WITH EIGHT BEAMS, WITHOUT BORE) | EXAMPLE 4 (WITH EIGHT BEAMS AND BORE) |
|---|---|---|---|---|
| PIEZO-ELECTRIC ELEMENT | circular: $\phi = 16$<br>Thickness: 50 μm + 16 μm<br>① lead zirconate titanate based ceramic<br>② silver/palladium alloy (70:30) | same as Example 1 | same as Example 1 | same as Example 1 |
| SEAT | circular: $\phi = 18$ mm<br>Thickness: 30 μm<br>material: phosphor bronze | same as Example 1 | beam: width 2 mm × length 1 mm<br>number of beams = 8 | same as Example 3 |
| VIBRATION FILM | circular: $\phi = 22$ mm<br>thickness: 80 μm<br>material: urethane | circular: $\phi = 22$ mm<br>thickness: 80 μm<br>bore diameter: $\phi = 17$ mm | same as Example 1 | circular: $\phi = 22$ mm<br>thickness: 80 μm<br>bore diameter: $\phi = 15$ mm |
| SUPPORTING MEMBER | inner diameter: $\phi = 21$ mm | same as Example 1 | same as Example 1 | same as Example 1 |
| RESONANT FREQUENCY | 898 | 847 | 812 | 809 |
| MAXIMUM VIBRATION SPEED AMPLITUDE | 275 | 295 | 348 | 367 |
| VIBRATION SPEED RATIO | 0.81 | 0.84 | 0.82 | 0.81 |
| VIBRATION MODE | piston type | piston type | piston type | piston type |
| SOUND PRESSURE LEVEL | 82 | 84 | 85 | 86 |
| DROP IMPACT STABILITY | ○ | ○ | ○ | ○ |

|  | EXAMPLE 5 (BIMORPH WITHOUT BORE) | EXAMPLE 6 (BIMORPH WITH BORE) | EXAMPLE 7 (WITH BIMORPH AND BEAMS) |
|---|---|---|---|
| PIEZO-ELECTRIC ELEMENT | same as Example 1 (two used) | same as Example 1 (two used) | same as Example 1 (two used) |
| SEAT | same as Example 1 | same as Example 1 | same as Example 3 |
| VIBRATION FILM | same as Example 1 | same as Example 2 | same as Example 1 |
| SUPPORTING MEMBER | same as Example 1 | same as Example 1 | same as Example 1 |
| RESONANT FREQUENCY | 927 | 901 | 905 |
| MAXIMUM VIBRATION SPEED AMPLITUDE | 468 | 487 | 502 |
| VIBRATION SPEED RATIO | 0.87 | 0.86 | 0.83 |
| VIBRATION MODE | piston type | piston type | piston type |
| SOUND PRESSURE LEVEL |  | 88 | 89 |
| DROP IMPACT STABILITY | ○ | ○ | ○ |

TABLE 2

|  | EXAMPLE 8 (CURVED SECTION) | EXAMPLE 9 (MODIFICATION TO EXAMPLE 1) | EXAMPLE 10 (WITH FOUR BEAMS: MODIFICATION TO EXAMPLE 3) | EXAMPLE 11 (WITH 12 BEAMS: MODIFICATION TO EXAMPLE 3) |
|---|---|---|---|---|
| PIEZO-ELECTRIC ELEMENT | same as Example 1 | same as Example 1 | same as Example 1 | same as Example 1 |
| SEAT | same as Example 1 | circular: $\phi = 18$ mm<br>thickness: 30 μm<br>material: phosphor bronze | beams: width 2 mm × length 1 mm<br>number of beams = 4 | beams: width 2 mm × length 1 mm<br>number of beams = 12 |

TABLE 2-continued

| | | | | |
|---|---|---|---|---|
| VIBRATION FILM | circular: φ = 21 mm thickness: 80 μm bore diameter: φ = 17 mm curved section included | same as Example 1 | same as Example 1 | same as Example 1 |
| SUPPORTING MEMBER | same as Example 1 | same as Example 1 | same as Example 1 | same as Example 1 |
| RESONANT FREQUENCY | 886 | 852 | 784 | 853 |
| MAXIMUM VIBRATION SPEED AMPLITUDE | 517 | 291 | 352 | 321 |
| VIBRATION SPEED RATIO | 0.81 | 0.84 | 0.82 | 0.81 |
| VIBRATION MODE | piston type | piston type | piston type | piston type |
| SOUND PRESSURE LEVEL | 90 | 83 | 85 | 84 |
| DROP IMPACT STABILITY | ○ | ○ | ○ | ○ |

| | EXAMPLE 12 (VIBRATION FILM MODIFIED IN EXAMPLE 1) | EXAMPLE 13 (RESTRAINING MEMBER MODIFIED IN EXAMPLE 1) | EXAMPLE 17 (REDUCED IN SIZE OF EXAMPLE 1) |
|---|---|---|---|
| PIEZO-ELECTRIC ELEMENT | same as Example 1 | same as Example 1 | circular: φ = 12 thickness: 50 μm + 16 μm ①lead zirconate titanate based ceramic ②silver/palladium alloy (70:30) |
| SEAT | same as Example 1 | circular: φ = 18 mm thickness: 40 μm material: 42 alloy | circular: φ = 14 mm thickness: 30 μm material: phosphor bronze |
| VIBRATION FILM | circular: φ = 21 mm thickness: 50 μm material PET bore diameter: φ = 17 mm | same as Example 1 | circular: φ = 18 mm thickness: 80 μm material: urethane |
| SUPPORTING MEMBER | same as Example 1 | same as Example 1 | inner diameter: φ = 16 mm |
| RESONANT FREQUENCY | 912 | 871 | 841 |
| MAXIMUM VIBRATION SPEED AMPLITUDE | 341 | 281 | 312 |
| VIBRATION SPEED RATIO | 0.80 | 0.82 | 0.82 |
| VIBRATION MODE | piston type | piston type | piston type |
| SOUND PRESSURE LEVEL | 83 | 83 | 83 |
| DROP IMPACT STABILITY | ○ | ○ | ○ |

Example 1

Figure 22A:
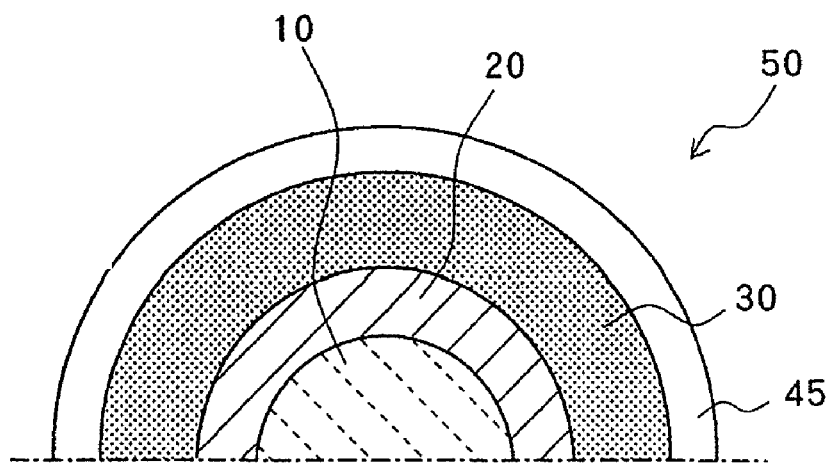
FIG. 22A A plan view showing the configuration of a piezo-electric actuator of Example 1.
Figure 22B:
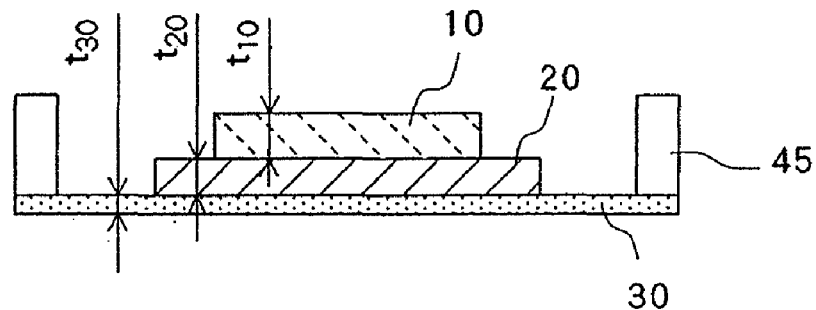
FIG. 22B A vertical sectional view of the configuration of the piezo-electric actuator of Example 1.

As Example 1, piezo-electric actuator 50 of the first embodiment (see FIGS. 3 and 4 as well) was fabricated with piezo-electric element 10 adhered on the top surface of the seat, as shown in FIGS. 22A and 22B. Though not an essential difference, vibration film 30 is adhered on the bottom surface of supporting member 45 in this example.

The specific configuration of each component is as follows.

Piezo-Electric Element 10: The upper electrode layer and lower electrode layer of 8 μm thick were formed respectively on both surface of a piezo-electric plate with the outer Diameter=φ16 mm and the thickness=50 μm (0.05 mm).

Seat 20: Phosphor bronze with the outer diameter=φ18 mm and the thickness=30 μm (0.03 mm) was used.

Vibration Film 30: A film made of urethane with the outer diameter=22 mm and the thickness=80 μm was used.

Supporting Member 45: SUS304 with the outer diameter=φ22 mm, the inner diameter of a frame extracted section=φ21 mm, and the thickness=1.5 mm was used.

Piezo-electric element 10, seat 20, vibration film 30, and supporting member 45 were placed in a concentric arrangement. Lead zirconate titanate based ceramic was used for the piezo-electric plate, while a silver/palladium alloy (weight ratio is 70%:30%) was used for the electrode layers. This piezo-electric element was manufactured by a green sheet method, where the piezo-electric plate was sintered at 1100° C. for two hours in the atmosphere, and subsequently, the piezo-electric material layer was polarized. The adhesion of piezo-electric element 10 with seat 20, the adhesion of seat 20 with vibration film 30, and the adhesion of supporting member 45 with vibration film 30 were all made using an epoxy-based adhesive.

[Results]

Resonant Frequency: 898 Hz
Maximum Vibration Speed Amplitude: 275 mm/s
Vibration Speed Ratio: 0.81
Vibration Mode: Piston Type
Sound Pressure Level: 82 dB
Drop Impact Stability: ○

As is apparent from the foregoing results, according to the piezo-electric actuator of this Example, the resonant frequency is as low as 1 kHz, and the vibration amplitude is large, so that it was demonstrated that a piston type vibration mode was taken. Also, the piezo-electric actuator (thickness of supporting member 45) was approximately 1.5 mm thick, and was sufficiently reduced in thickness.

For reference, in this Example, thickness t10 of the piezo-electric element is equal to 50 μm, thickness t20 of the seat is equal to 30 μm, so that their ratio is calculated to be t20/t10=0.6. However, this ratio t20/t10 is not so limited, but may be equal to or larger than 0.2 and less than 2.0 (0.2≦t20/t10<2.0) in the piezo-electric actuator of the present invention. As an example, the thickness of the seat may be 100 μm for the piezo-electric element of 50 μm thick.

Comparative Example 1

Figure 23:
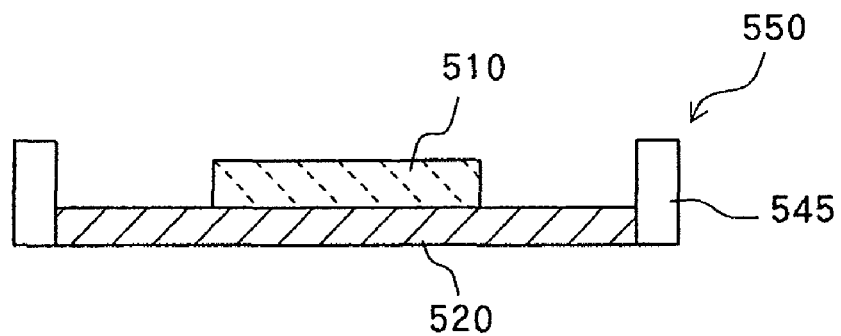
FIG. 23 A vertical sectional view showing the configuration of a piezo-electric actuator of Comparative Example 1.

As Comparative Example 1, a conventional piezo-electric actuator was fabricated with the outer periphery of a seat directly bonded to a supporting member, as shown in FIG. 23. This piezo-electric actuator 550 has a similar configuration to that shown in FIG. 1. In this regard, piezo-electric element 510, seat 520, and supporting member 545 are made of the same materials as piezo-electric element 10, seat 20, and supporting member 45 of the aforementioned Example 1.

The specific configuration of each component is as follows.
Piezo-Electric Element 510: Same as Piezo-Electric Element 10 of Example 1
Seat 520: Outer Diameter=φ21 mm (the thickness and material are the same as those of seat 20 of Example 1)
Supporting Member 545: Same as Supporting Member 45 of Example 1
Piezo-electric element 510, seat 520, and supporting member 530 were placed in a concentric arrangement.
[Results]
Resonant Frequency: 1418 Hz
Maximum Vibration Speed Amplitude: 47 mm/s
Vibration Speed Ratio: 0.31
Vibration Mode: Flexion Type
Drop Impact Stability: X Example 2

Figure 24A:
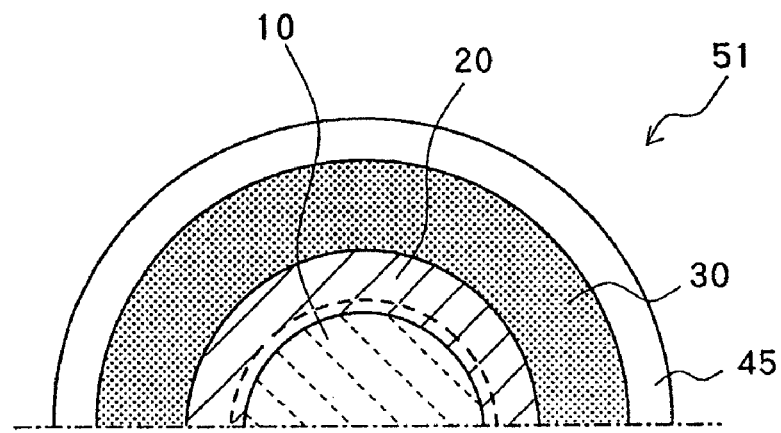
FIG. 24A A plan view showing the configuration of a piezo-electric actuator of Example 2.
Figure 24B:
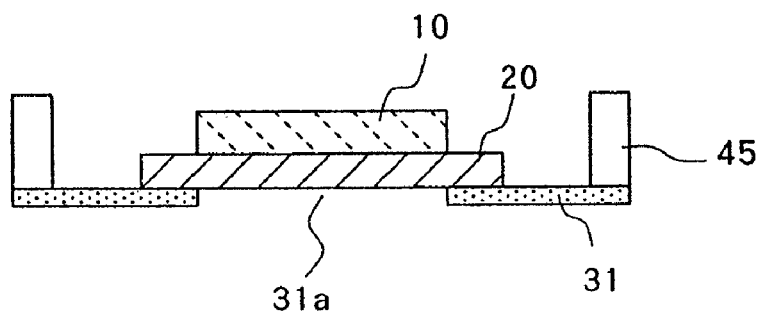
FIG. 24B A vertical sectional view showing the configuration of the piezo-electric actuator of Example 2.

As Example 2, piezo-electric actuator 51 of the second embodiment type (see FIGS. 11A and 11B as well) was fabricated, as shown in FIGS. 24A and 24B. In piezo-electric actuator 51 of this Example, vibration film 31 is formed with opening 31a.
Specific configurations of each component are as follows.
Piezo-Electric Element 10: Same as Example 1
Seat 20: Same as Example 1
Vibration Film 30: Outer Diameter=φ21 mm, and Inner Diameter (diameter of the opening)=φ17 mm (the thickness and material are the same as those of vibration film 30 of Example 1)
Supporting Member 45: Same as Example 1
Opening 31a was formed at the center of vibration film 31.
[Results]
Resonant Frequency: 847 Hz
Maximum Vibration Speed Amplitude: 295 mm/s
Vibration Speed Ratio: 0.84
Vibration Mode: Piston Type
Sound Pressure Level: 84 dB
Drop Impact Stability: ○

As is apparent from the foregoing, according to the piezo-electric actuator of this Example, it was demonstrated that the resonant frequency is again lower than Example 1, and the vibration amplitude is larger.

Example 3

Figure 25A:
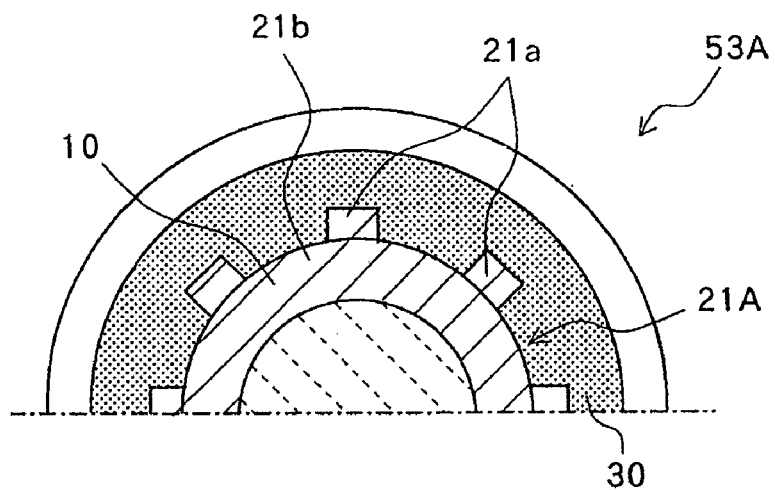
FIG. 25A A plan view showing the configuration of a piezo-electric actuator of Example 3.
Figure 25B:
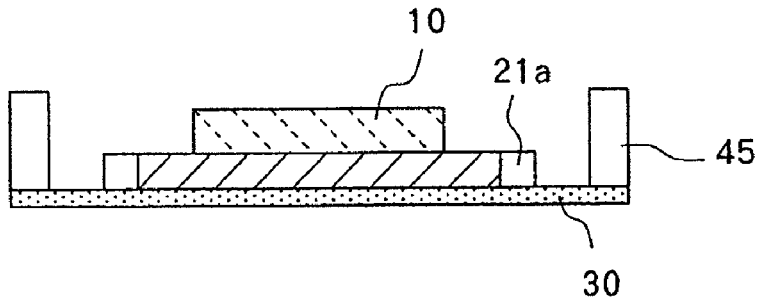
FIG. 25B A vertical sectional view showing the configuration of the piezo-electric actuator of Example 3.

As Example 3, the piezo-electric actuator of the fourth embodiment type (see FIG. 13 as well) was fabricated as shown in FIGS. 25A and 25B. Piezo-electric actuator 53A of this Example has eight beams 21a provided on seat 21A.
Specific configurations of each component are as follows.
Piezo-Electric Element 10: Same as Example 1
Seat 21A: The thickness and material are the same as seat 20 of Example 1.
Beams 21a: eight beams radially arranged at equal intervals, where each beam 21a has a beam width of 2 mm (fixed width) and a length of 1 mm.
Body Section 21b: Outer Diameter=φ18 mm
Vibration Film 30: Same as Example 1
Supporting Member 45: Same as Example 1
[Results]
Resonant Frequency: 812 Hz
Maximum Vibration Speed Amplitude: 348 mm/s
Vibration Speed Ratio: 0.82
Vibration Mode: Piston Type
Sound Pressure Level: 85 dB
Drop Impact Stability: ○

As is apparent from the foregoing, according to the piezo-electric actuator of this Example, it was demonstrated that the resonant frequency is again lower than Example 1, and the vibration amplitude is larger.

Example 4

Figure 26A:
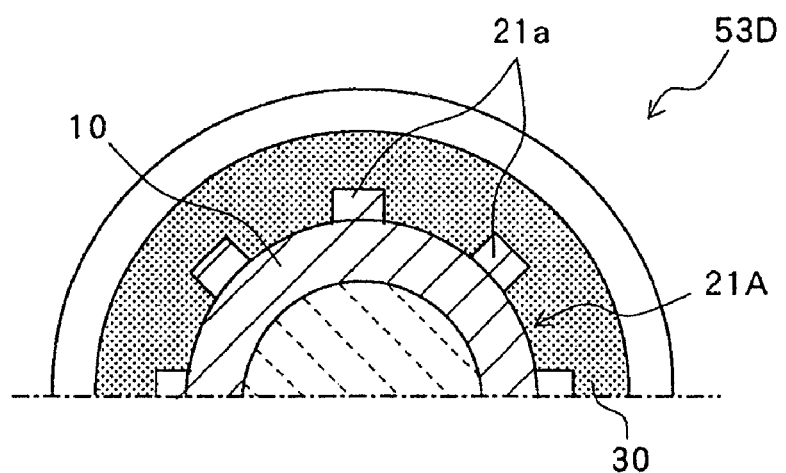
FIG. 26A A plan view showing the configuration of a piezo-electric actuator of Example 4.
Figure 26B:
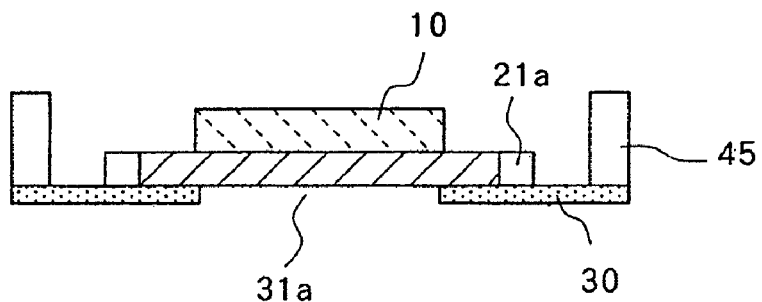
FIG. 26B A vertical sectional view showing the configuration of the piezo-electric actuator of Example 4.

As Example 4, a piezo-electric actuator was fabricated, as shown in FIGS. 26A and 26B. Piezo-electric actuator 53D of this Example was configured as an exemplary modification to the aforementioned Example 3, and comprises vibration film 31 formed with opening 31a instead of vibration film 30. The rest of the configuration is the same as the third example.
Specific configurations of each component are as follows.
Piezo-Electric Element 10: Same as Example 1 (same as Example 3)
Seat 21A: Same as Example 3
Vibration Film 31: Outer Diameter=φ22 mm, and Inner Diameter (diameter of the opening)=φ15 mm (the thickness and material are the same as those of vibration film 30 of Example 1)
Supporting Member 45: Same as Example 1
Opening 31a was formed at the center of vibration film 31.
[Results]
Resonant Frequency: 809 Hz
Maximum Vibration Speed Amplitude: 367 mm/s
Vibration Speed Ratio: 0.81
Vibration Mode: Piston Type
Sound Pressure Level: 86 dB
Drop Impact Stability: ○

As is apparent from the foregoing, according to the piezo-electric actuator of this Example, it was demonstrated that the resonant frequency is again lower than Example 3, and the vibration amplitude is larger.

Example 5

Figure 27:
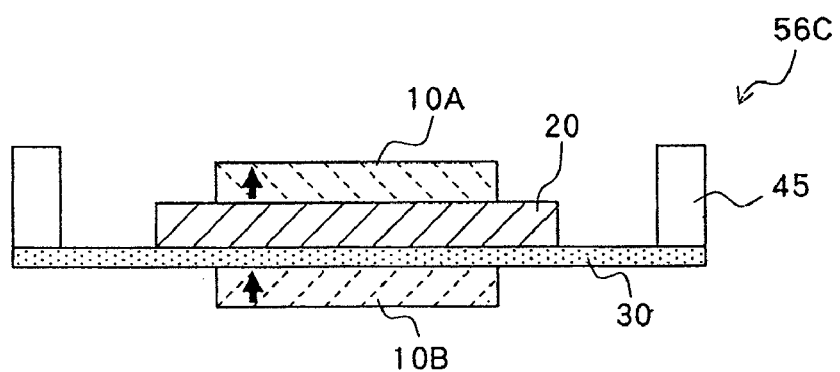
FIG. 27 A vertical sectional view showing the configuration of the piezo-electric actuator of Example 5.

As Example 5, bimorph type piezo-electric actuator 56C was fabricated, as shown in FIG. 27. Piezo-electric actuator 56C of this Example is modified to a bimorph type by disposing additional piezo-electric element 10B on the back surface of vibration film 30 of piezo-electric actuator 50 (see FIGS. 22A and 22B) of Example 1. Specifically, piezo-electric element 10B is attached to the bottom side of seat 20 with vibration film 30 interposed therebetween, as shown.

Specific configurations of each component are as follows.
Piezo-Electric Element 10A: Same as Piezo-Electric Element 10 of Example 1
Piezo-Electric Element 10B: The basic configuration is the same as piezo-electric element 10 (however, configured to perform reverse operations to piezo-electric element 10A)
Seat 20: Same as Example 1
Vibration Film 30: Same as Example 1
Supporting Member 45: Same as Example 1
[Results]
Resonant Frequency: 927 Hz
Maximum Vibration Speed Amplitude: 468 mm/s
Vibration Speed Ratio: 0.87
Vibration Mode: Piston Type
Sound Pressure Level: 88 dB
Drop Impact Stability: ○

As is apparent from the foregoing, according to the piezo-electric actuator of this Example, it was demonstrated that the resonant frequency is lower, and the vibration amplitude is larger than Example 1.

Example 6

Figure 28:
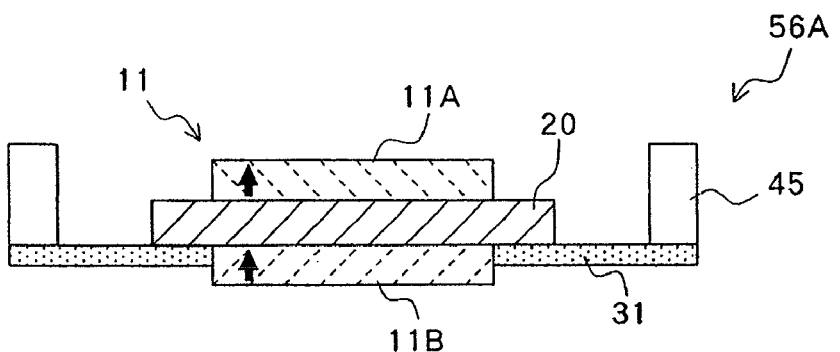
FIG. 28 A vertical sectional view showing the configuration of the piezo-electric actuator of Example 6.

As Example 6, the piezo-electric actuator of the seventh embodiment type (see FIG. 19 as well) was fabricated, as shown in FIG. 28. In piezo-electric actuator 56A of this Example, an opening is formed through the vibration film, and piezo-electric elements 11A, 11B are adhered directly to both surfaces of seat 20.

Specific configurations of each component are as follows.
Piezo-Electric Element 11A: Same as Piezo-Electric Element 10 of Example 1
Piezo-Electric Element 11B: The basic configuration is the same as piezo-electric element 10 (however, configured to perform reverse operations to piezo-electric element 11A)
Seat 20: Same as Example 1
Vibration Film 31: Same as Example 2 (formed with an opening)
Supporting Member 45: Same as Example 1
[Results]
Resonant Frequency: 901 Hz
Maximum Vibration Speed Amplitude: 487 mm/s
Vibration Speed Ratio: 0.86
Vibration Mode: Piston Type
Sound Pressure Level: 88 dB
Drop Impact Stability: ○

As is apparent from the foregoing, according to the piezo-electric actuator of this Example, it was demonstrated that the resonant frequency is lower, and the vibration amplitude is larger than Example 1.

Example 7

Figure 29:
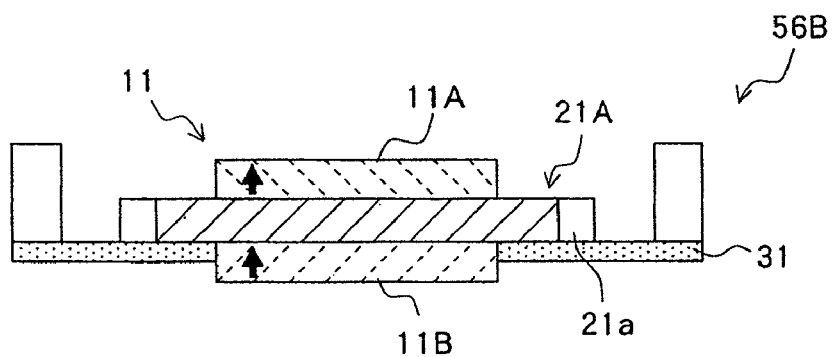
FIG. 29 A vertical sectional view showing the configuration of the piezo-electric actuator of Example 7.

As Example 7, piezo-electric actuator 56B was fabricated, as shown in FIG. 29. In piezo-electric actuator 56B of this Example, the seat of piezo-electric actuator 56A of the aforementioned Example 6 was replaced with one comprising beams. Specifically, additional piezo-electric element 11B was adhered on the back surface of seat 21A of actuator 53D shown in Example 4 (see FIGS. 26A and 26B) to provide piezo-electric element 11'.

Specific configurations of each component are as follows.
Piezo-Electric Element 11A: Same as Piezo-Electric Element 10 of Example 1
Piezo-Electric Element 11B: The basic configuration is the same as piezo-electric element 10 (however, configured to perform reverse operations to piezo-electric element 11A)
Seat 21A: Same as Example 4
Vibration Film 31: Same as Example 4
Supporting Member 45: Same as Example 1
[Results]
Resonant Frequency: 905 Hz
Maximum Vibration Speed Amplitude: 502 mm/s
Vibration Speed Ratio: 0.83
Vibration Mode: Piston Type Motion
Sound Pressure Level: 89 dB
Drop Impact Stability: ○

As is apparent from the foregoing, according to the piezo-electric actuator of this Example, it was demonstrated that the resonant frequency is lower, and the vibration amplitude is larger than Example 1.

Example 8

Figure 30:
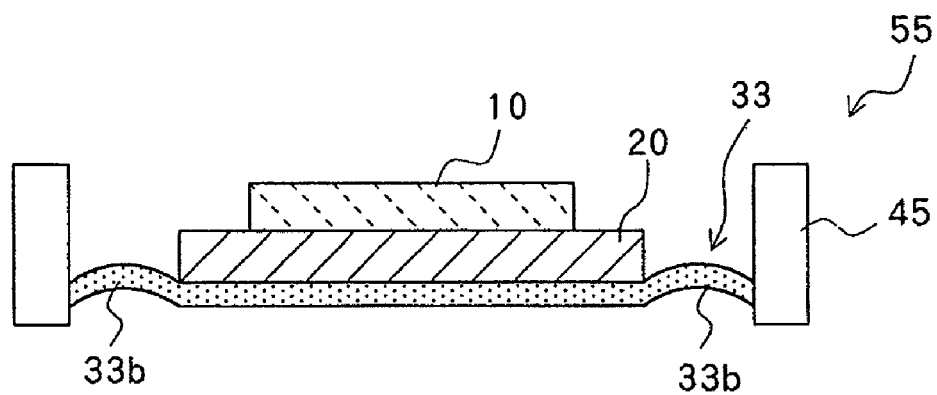
FIG. 30 A plan view showing the configuration of the piezo-electric actuator of Example 8.

As Example 8, the piezo-electric actuator of the sixth embodiment type (see FIG. 18 as well) was fabricated, as shown in FIG. 30. Piezo-electric actuator 55 of this Example changed the shape of the vibration film of the piezo-electric actuator of Example 1. Specifically, curved section 33b was provided in the gap between the outer periphery of the seat and the inner periphery of the supporting member. The rest of the configuration is the same as the piezo-electric actuator of Example 1.

The specific configuration of each component is as follows.
Piezo-Electric Element 10: Same as Example 1
Seat 20: Same as Example 1
Vibration Film 33: the outer diameter=21 mm, the inner diameter of a frame extracted section=ϕ17 mm (the thickness and material are the same as film 30 of Example 1)
Curved Section 33b: Radius r of Curvature=6 mm
Supporting Member 45: Same as Example 1
[Results]
Resonant Frequency: 886 Hz
Maximum Vibration Speed Amplitude: 517 mm/s
Vibration Speed Ratio: 0.81
Vibration Mode: Piston Type
Sound Pressure Level: 90 dB
Drop Impact Stability: ○

As is apparent from the foregoing, according to the piezo-electric actuator of this Example, it was demonstrated that the resonant frequency is further lower than Example 1, and the vibration amplitude is larger.

Example 9

A piezo-electric actuator (not shown) was fabricated in the following manner as Example 9. This piezo-electric actuator is reduced in size of seat 20 of piezo-electric actuator 50 of Example 1 (though not shown, this is called "seat 20'" for distinction). The rest of the configuration is the same as the piezo-electric actuator of Example 1. With the reduced size of the seat, the gap distance between the supporting member and the restraining member is longer as compared with Example 1.

The specific configuration of each component is as follows. For the configuration, see FIGS. 22A and 22B.
Piezo-Electric Element 10: Same as Example 1
Seat 20': Outer Diameter=φ16 mm (reduced by 2 mm) (the thickness and material are the same as Example 1)
Vibration Film 30: Same as Example 1
Supporting Member 45: Same as Example 1
[Results]
Resonant Frequency: 852 Hz
Maximum Vibration Speed Amplitude: 291 mm/s
Vibration Speed Ratio: 0.84
Vibration Mode: Piston Type
Sound Pressure Level: 83 dB
Drop Impact Stability: ○
As is apparent from the foregoing, like this Example, the resonant frequency can be adjusted by changing the gap distance between the supporting member and the restraining member, and it was demonstrated that the resonant frequency is further lower than Example 1, and the vibration amplitude is larger.

Example 10

Figure 31:
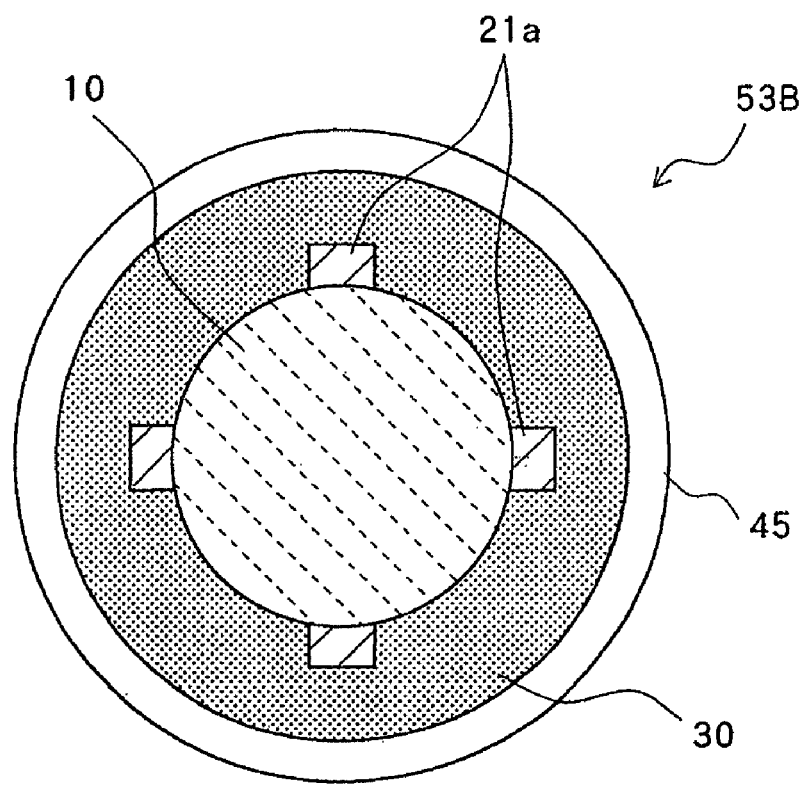
FIG. 31 A plan view showing the configuration of the piezo-electric actuator of Example 10.

A piezo-electric actuator was fabricated as Example 10, as shown in FIG. 31. In piezo-electric actuator 53B of this Example, the number of beams was changed (from eight to four) on the seat of Example 3. The rest of the configuration is the same as the piezo-electric actuator of Example 3.
Specific configurations of each component are as follows.
Piezo-Electric Element 10: Same as Example 3
Seat: The thickness and material are the same as Example 3.
Beams 21a: Four beams radially arranged at equal intervals (the shape of the beams themselves is the same as Example 3)
Body Section 21b: Same as Example 3
Vibration Film 30: Same as Example 1
Supporting Member 45: Same as Example 1
[Results]
Resonant Frequency: 784 Hz
Maximum Vibration Speed Amplitude: 352 mm/s
Vibration Speed Ratio: 0.82
Vibration Mode: Piston Type
Sound Pressure Level: 85 dB
Drop Impact Stability: ○
As is apparent from the foregoing, according to the piezo-electric actuator of this Example, it was demonstrated that the resonant frequency is lower, and the vibration amplitude is larger.

Example 11

Figure 32:
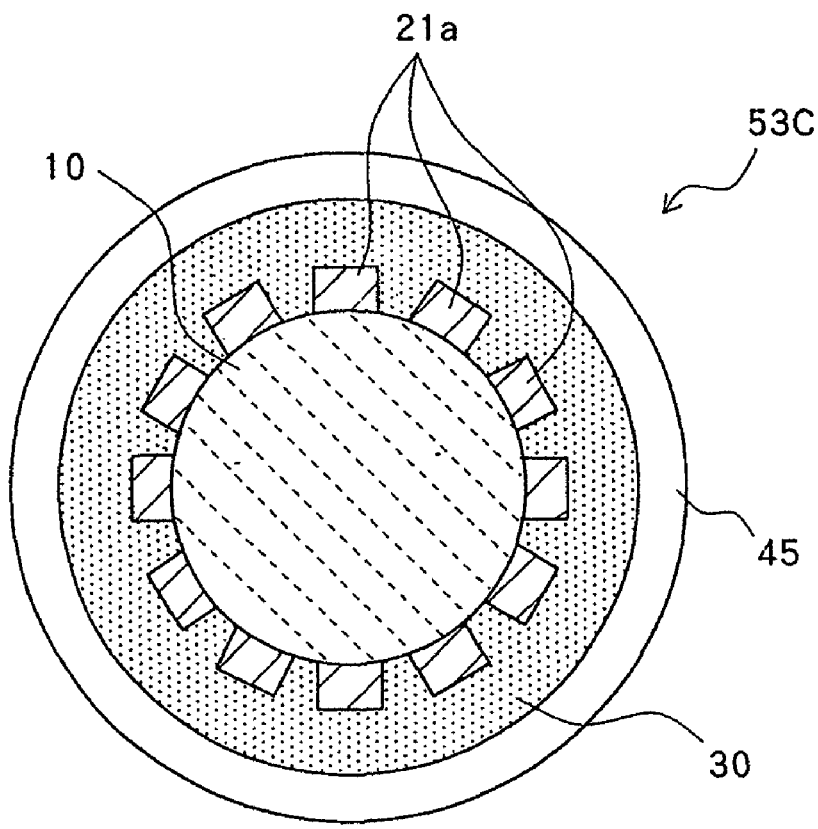
FIG. 32 A vertical sectional view showing the configuration of the piezo-electric actuator of Example 11.

A piezo-electric actuator was fabricated as Example 11, as shown in FIG. 32. In piezo-electric actuator 53C of this Example, the number of beams was changed (from eight to 12) on the seat of Example 3. The rest of the configuration is the same as the piezo-electric actuator of Example 3.
Specific configurations of each component are as follows.
Piezo-Electric Element 10: Same as Example 3
Seat: The thickness and material are the same as Example 3.
Beams 21a: 12 beams radially arranged at equal intervals (the shape of the beams themselves is the same as Example 3)
Body Section 21b: Same as Example 3
Vibration Film 30: Same as Example 1
Supporting Member 45: Same as Example 1
[Results]
Resonant Frequency: 853 Hz
Maximum Vibration Speed Amplitude: 321 mm/s
Vibration Speed Ratio: 0.81
Vibration Mode: Piston Type
Sound Pressure Level: 84 dB
Drop Impact Stability: ○
As is apparent from the foregoing, according to the piezo-electric actuator of this Example, it was demonstrated that the resonant frequency is lower, and the vibration amplitude is larger.

Example 12

As Example 12, a piezo-electric actuator (not shown) was fabricated in the following manner. In this piezo-electric actuator, the material of vibration film was changed (from urethane to PET) in piezo-electric actuator 50 of Example 1. The rest of the configuration is the same as the piezo-electric actuator of Example 1.
Specific configurations of each component are as follows.
Piezo-Electric Element 10: Same as Example 1
Seat 20: Same as Example 3.
Vibration Film 31: The shape is the same as Example 1. PET of 50 μm thick is used.
Supporting Member 45: Same as Example 1
[Results]
Resonant Frequency: 912 Hz
Maximum Vibration Speed Amplitude: 341 mm/s
Vibration Speed Ratio: 0.80
Vibration Mode: Piston Type Motion
Sound Pressure Level: 83 dB
Drop Impact Stability: ○
As is apparent from the foregoing, according to the piezo-electric actuator of this Example, it was demonstrated that the resonant frequency is low and the vibration amplitude is large in a similar degree to Example 1.

Example 13

As Example 13, a piezo-electric actuator (not shown) was fabricated in the following manner. In this piezo-electric actuator, the material of seat 20 of piezo-electric actuator 50 was changed in Example 1, and a PET film was used for vibration film 30. The rest of the configuration is the same as the piezo-electric actuator of Example 1.
Specific configurations of each component are as follows.
Piezo-Electric Element 10: Same as Example 1
Seat 20: The shape is the same as Example 1. 42 alloy of 40 μm thick is used.
Vibration Film 30: PET of 50 μm thick is used.
Supporting Member 45: Same as Example 1
[Results]
Resonant Frequency: 871 Hz
Maximum Vibration Speed Amplitude: 281 mm/s
Vibration Speed Ratio: 0.82
Vibration Mode: Piston Type
Sound Pressure Level: 82 dB
Drop Impact Stability: ○
As is apparent from the foregoing, according to the piezo-electric actuator of this Example, it was demonstrated that the resonant frequency is low and the vibration amplitude is large in a similar degree to Example 1.

Comparative Example 2

Figure 33:
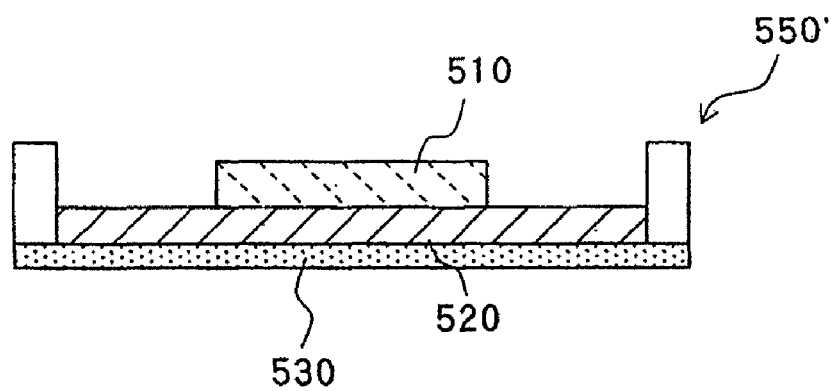
FIG. 33 A vertical sectional view showing the configuration of the piezo-electric actuator of Comparative Example 2.

As Comparative Example 2, piezo-electric actuator 550' was fabricated, as shown in FIG. 33. This piezo-electric actuator comprises vibration film 530 (same as film 30 in Example 1) on the back surface of seat 520 of the actuator of Comparative Example 1 (see FIG. 23). Accordingly, the configuration except for vibration film 530 is completely the same as Comparative Example.
[Results]
  Resonant Frequency: 1498 Hz
  Sound Pressure Level: 65 dB Next, a description will be given of an example in which an acoustic element is equipped in a portable telephone with reference to Examples 14-16 and Comparative Example 3.

Example 14

Portable Telephone 1

Figure 34:
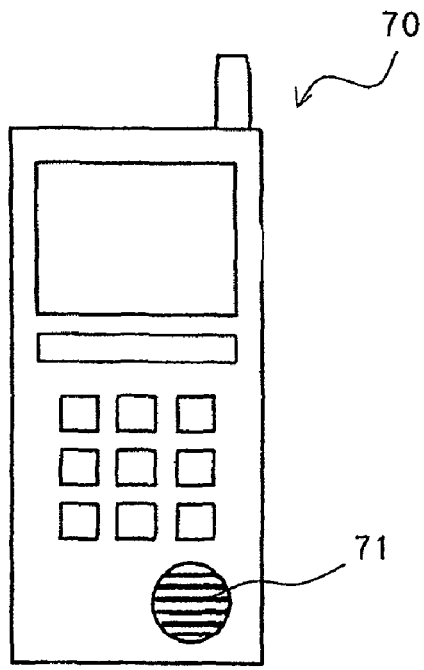
FIG. 34 A front view showing an example of a portable telephone which is equipped with a piezo-electric actuator according to the present invention.

Portable telephone 70 as shown in FIG. 34 was provided as Example 14, and piezo-electric actuator 50 of Example 1 (see FIGS. 22A and 22B) was equipped in this housing. Specifically, piezo-electric actuator 50 was adhered on the inner surface of the housing of speaker section 71 of the portable telephone.
(Evaluation): The sound pressure level and frequency characteristic were measured by a microphone disposed at a position 10 cm away from the element. Also, a drop and impact test was conducted.
[Results]
  Resonant Frequency: 795 Hz
  Sound Pressure Level: 82 dB
  Frequency Characteristic: A flat characteristic was exhibited.
  Drop and Impact Test: No crack appeared in the piezo-electric element even after five drops. After the test, the sound pressure level was measured to be 84 dB.

Example 15

Portable Telephone 2

As Example 15, piezo-electric actuator 53A of Example 3 (see FIGS. 25A and 25B) was equipped in portable telephone 70 in a manner similar to the foregoing embodiment. The evaluations are similar to the foregoing embodiment.
[Results]
  Resonant Frequency: 855 Hz
  Sound Pressure Level: 84 dB
  Frequency Characteristic: A flat characteristic was exhibited.
  Drop and Impact Test: No crack appeared in the piezo-electric element even after five drops. After the test, the sound pressure level was measured to be 84 dB.

Comparative Example 3

Portable Telephone 3

As Comparative Example 3, piezo-electric actuator 550' of Comparative Example 2 (see FIG. 33) was equipped in portable telephone 70 in a manner similar to the foregoing embodiment.
(Evaluation): The sound pressure level and frequency characteristic were measured by a microphone disposed at a position 10 cm away from the element. Also, a drop and impact test was conducted.
[Results]
  Resonant Frequency: 1520 Hz
  Sound Pressure Level: 66 dB
  Frequency Characteristic: A frequently varying characteristic was exhibited.
  Drop and Impact Test: A crack appeared in the piezo-electric element after two drops, and at this time, the sound pressure level was measured to be 50 dB or lower.

Comparative Example 4

Electromagnetic Actuator

Figure 35:
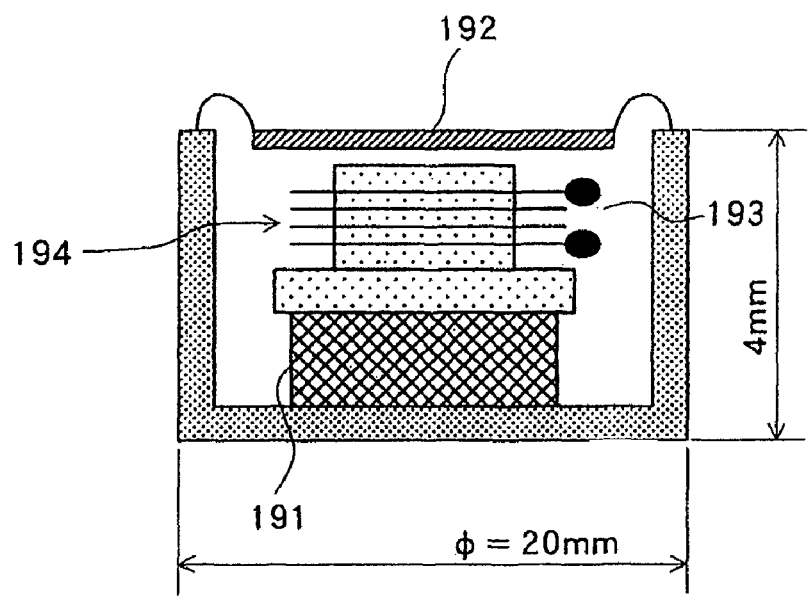
FIG. 35 A cross-sectional view showing the configuration of an acoustic element of a conventional type which is provided as Comparative Example 4.

As Comparative Example 4, an electromagnetic acoustic element was fabricated, as shown in FIG. 35. The acoustic element shown in FIG. 35 comprises permanent magnet 191, voice coil 193, and vibration plate 192, where a magnetic force is generated by applying a current to the voice coil through electric terminal 194, and sound is generated by causing vibration plate 192 to repeat absorption and repulsion with the generated magnetic force. The outer shape of this acoustic element is a circular shape with an outer shape equal to φ20 mm and a thickness equal to 4.0 mm.
(Evaluation): For the acoustic element thus configured, the sound pressure level and frequency characteristic were measured by a microphone disposed at a position 30 cm away from the element.
[Results]
  Resonant Frequency=810 Hz
  Sound Pressure Level=83 dB Example 16

PC

A notebook type personal computer (not shown) equipped with the piezo-electric actuator of Example 1 was fabricated as Example 16. Specifically, as is the case with the portable telephone, piezo-electric actuator 50 was adhered on the inner surface of the housing of the personal computer.
(Evaluation): the sound pressure level and frequency characteristic were measured by a microphone disposed at a position 30 cm away from the element. A drop and impact test was also conducted.
[Results]
  Resonant Frequency: 816 Hz
  Sound Pressure Level: 81 dB
  Drop and Impact Test: No crack appeared in the piezo-electric element even after five drops. After the test, the sound pressure level was measured to be 89 dB.

Example 17

A piezo-electric actuator as shown below was fabricated as Example 17. This piezo-electric actuator was reduced in size of piezo-electric actuator 50 of Example 1.
Specific configurations of each component are as follows.
  Piezo-Electric Element 10: Outer Diameter=φ12 mm (reduced by 4 mm), and the thickness and material are the same as Example 1.
  Seat 20: Outer Diameter=φ14 mm (reduced by 4 mm), and the thickness and material are the same as Example 1.
  Vibration Film 30: Outer Diameter=φ18 mm (reduced by 4 mm), and the thickness and material are the same as Example 1.
  Supporting Member 45: Diameter=φ18 mm (reduced by 4 mm), Inner Diameter=φ16 mm, and the thickness and material are the same as Example 1.
[Results]
  Resonant Frequency: 841 Hz
  Maximum Vibration Speed Amplitude: 312 mm/s
  Vibration Speed Ratio: 0.82

Vibration Mode: Piston Type
Sound Pressure Level: 83 dB
Drop Impact Stability: ○

As is apparent from the foregoing, according to the piezo-electric actuator of this Example, it was demonstrated that the resonant frequency is low and the vibration amplitude is large in a similar degree to Example 1.

(Conclusion)

The acoustic elements which employed the piezo-electric actuators of Examples 1-13 exhibited frequency characteristics close to the frequency characteristic of Comparative Example 4 (electromagnetic actuator). On the other hand, in the conventional piezo-electric actuator of Comparative. Example 3, fierce jaggedness appeared on the graph of the frequency characteristic. It was demonstrated, also from this aspect, that the frequency characteristic of the acoustic element is improved according to the present invention. Particularly, in any of the Examples, resonant frequency f0 is lower than resonant frequency f0 of Comparative Examples, and from this fact, it was demonstrated that the frequency bandwidth of the acoustic element according to the present invention expanded. Also, in Examples 14, 15 which were implemented in portable telephones, the resonant frequency was lower, and the sound pressure level was also improved, as compared with Comparative Example 3.

Example 18

Verification of Film Thickness Dependence

While advantageous effects of the present invention have been verified by changing the shape, material and the like of each member as Example 1-Example 17, a description will now be given of the result of changing the shape of only one member, from among piezo-electric element 10, seat 20, and vibration film 30, in steps. First, as Example 18, the thickness of vibration film (film) 30 was changed in various manners while the thicknesses of piezo-electric element 10 and seat 20 remained unchanged. In this regard, structural components except for vibration film 30 are the same as those of Example 1, and evaluation conditions are also the same as Example 1.

The specific configuration of each component is as follows.

Piezo-Electric Element 10: Same as Example 1 (an upper electrode layer and a lower electrode layer of 8 μm thick were formed respectively on both surfaces of a piezo-electric plate of 50 μm thick).

Seat 20: Same as Example 1 (Thickness=30 μm)

Vibration Film 30: Urethane was used in a similar manner to Example 1, and the thickness was changed from 30 μm to 200 μm in various manners.

Supporting Member 45: Same as Example 1

The results of resonant frequency f0 and sound pressure level are shown in Table 3 when the thickness of vibration film 30 was changed.

TABLE 3

| No. | FILM THICK-NESS[μm] | RESONANT FREQUENCY $f_0$[Hz] | SOUND PRESSURE LEVEL [dB] |
|---|---|---|---|
| A-1 | 30 | 678 | 76 |
| A-2 | 60 | 824 | 81 |
| A-3 | 80 | 899 | 82 |
| A-4 | 110 | 1015 | 81 |
| A-5 | 160 | 1203 | 80 |
| A-6 | 200 | 1578 | 74 |

As can be seen from the results of Table 3, for example, (a) when an actuator is designed to have a resonant frequency at approximately 1 kHz (including 1015 Hz) or lower in favor of reproduction in a low sound region, conditions as shown in No. A-1-A-4 in the table may be utilized. The ratio of vibration film thickness t30 to seat thickness t20 is shown as the basis in the following manner.

Specifically, thickness t30 of the film may be equal to or smaller than 110 μm (30 μm-110 μm) with respect to seat thickness t20 fixed to 30 μm, and stated another way, the value of (vibration film thickness t30/(seat thickness t20) may be equal to or smaller than 110 μm/30 μm=3.67 or smaller.

Alternatively, when an actuator is designed to provide a sound pressure level at 80 dB or higher in favor of (b) sound pressure, conditions as shown in A-2-A-5 may be utilized. Showing the ratio of vibration film thickness t30 to seat thickness t20 as the basis, the value of (vibration film thickness t30)/(seat thickness t20) may exit within a range of 2.0 to 5.33.

Further, as (c) a combination of the aforementioned a and b, when an actuator is designed to have a resonant frequency at approximately 1 kHz or lower and provide a sound pressure level of 80 dB or lower, conditions as shown in No. A-2-A-4 may be utilized. In other words, the value of (vibration film thickness t30)/(seat thickness t20) may exist within a range of 2.0 to 3.67.

Example 19

Verification of Contour Shape Dependence

Figure 36:
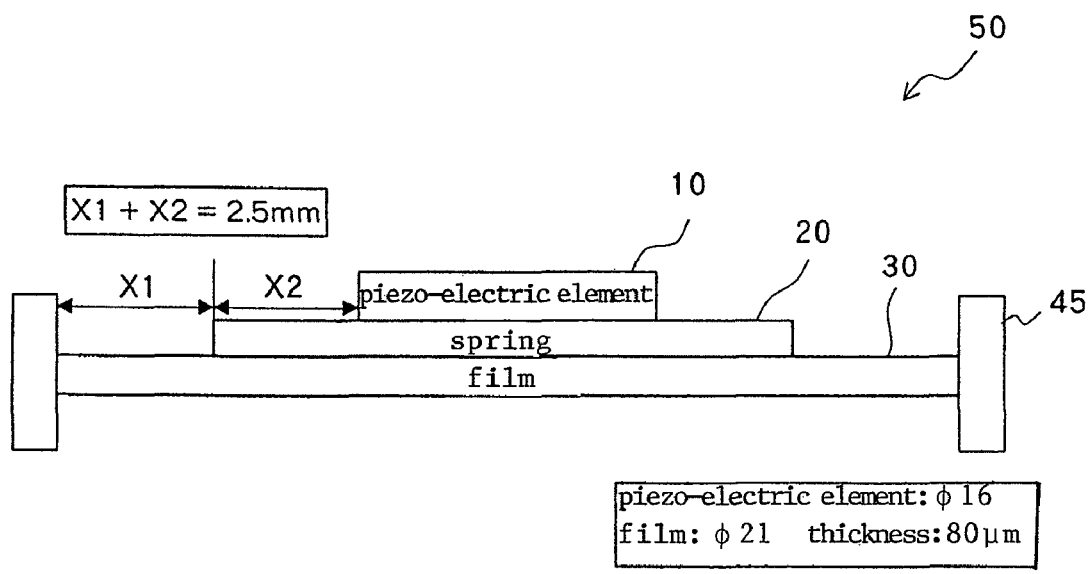
FIG. 36 A vertical sectional view for describing a piezo-electric actuator of Example 19.

Next, as Example 19, a verification is made on circular seat 20, the outer diameter of which is solely changed in various manners while fixing the contour shape of vibration film 30. In this Example, only the contour shape of seat 20 is changed, while structural components except for seat 20 are the same as those of Example 1, and evaluation conditions are the same as Example 1 as well. As shown in FIG. 36, X2 designates the distance between the outer periphery of piezo-electric element 10 and the outer periphery of seat 20, and X1 designates the distance between the outer periphery of seat 20 and the outer periphery of film 30 (the same as the inner periphery of supporting member 45).

The specific configuration of each component is as follows.

Piezo-Electric Element 10: Same as Example 1 (Outer Diameter=φ16 mm)

Seat 20: The outer diameter was changed such that distance X1 is 0.25 mm to 2.0 mm.

Vibration Film 30: Same as Example 1 (Outer Diameter=φ21 mm)

Supporting Member 45: Same as Example 1

Table 4 shows the results of resonant frequency f0 and sound pressure level when the contour shape of seat 20 was changed little by little.

TABLE 4

| No. | $X_1$[mm] | $X_2$[mm] | RESONANT FREQUENCY $f_0$[Hz] | SOUND PRESSURE LEVEL [dB] |
|---|---|---|---|---|
| B-1 | 0.25 | 2.25 | 1125 | 74 |
| B-2 | 0.5 | 2.0 | 1062 | 80 |
| B-3 | 0.75 | 1.75 | 1001 | 80 |
| B-4 | 1.0 | 1.5 | 924 | 81 |
| B-5 | 1.25 | 1.25 | 898 | 82 |
| B-6 | 1.5 | 1.0 | 804 | 81 |
| B-7 | 1.75 | 0.75 | 772 | 80 |
| B-8 | 2.0 | 0.5 | 631 | 76 |

As can be seen from the result of Table 4, for example, (a) when an actuator is designed to have a resonant frequency at approximately 1 kHz (including 1001 Hz) or lower in favor of reproduction in a low sound region, conditions as shown in No. B-3-B-8 in the table may be utilized. On the other hand, (b) when one wants to design an actuator with 80 dB or more in favor of the sound pressure level, conditions as shown in No. B-2-B-7 in the table may be utilized.

Example 20

Experiment for Verifying Flection Amount of Vibration Film

As Example 20, a verification is made on the relationship between a flection amount of vibration film intervening section A and acoustic characteristic. In the following Examples 20a-20c, the material of the vibration film, the length of vibration film intervening section A, and the thickness of the vibration film were solely changed to verify the relationship between the flection amount of vibration film intervening section A and the motion mode.

Example 20a

Example 20a only changes the material of the vibration film, and is the same as Example 2 except for the material of the vibration film, and evaluation conditions are also the same as Example 2.

The specific configuration of each component is as follows.

Piezo-Electric Element 10: Same as Example 2 (Outer Diameter=$\phi$16 mm)

Seat 20: Same as Example 2

Vibration Film 31: changed to a material having Young's modulus in a range of $4.0\times10^8$-to $13.0\times10^{10}$ (N/m$^2$).

The shape of the vibration film is the same as Example 2.

Supporting Member 45: Same as Example 2

Table 5 shows the relationship between the flection amount and the vibration mode, as well as the result of resonant frequency F0 and sound pressure level when the material of the vibration film time was changed.

TABLE 5

| No. | MATERIAL OF VIBRATION FILM | YOUNG'S MODULUS OF MATERIAL OF VIBRATION FILM (N/m$^2$) | DISTANCE × 2 (m) | THICKNESS OF VIBRATION FILM (m) | MAXIMUM FLECTION AMOUNT δ (m) | $F_0$ (Hz) | SOUND PRESSURE LEVEL (dB) | VIBRATION MODE |
|---|---|---|---|---|---|---|---|---|
| C-1 | urethane | $4\times10^8$ | 0.0015 | $8.0\times10^{-5}$ | 0.066 | 847 | 84 | piston motion |
| C-2 | PET | $9.1\times10^8$ | 0.0015 | $8.0\times10^{-5}$ | 0.029 | 970 | 86 | piston motion |
| C-3 | polyethylene | $1\times10^9$ | 0.0015 | $8.0\times10^{-5}$ | 0.026 | 1011 | 87 | piston motion |
| C-4 | polypropylene | $1.8\times10^9$ | 0.0015 | $8.0\times10^{-5}$ | 0.014 | 1075 | 85 | piston motion |
| C-5 | nylon | $2.5\times10^9$ | 0.0015 | $8.0\times10^{-5}$ | 0.011 | 1150 | 84 | piston motion |
| C-6 | polyester | $4.6\times10^9$ | 0.0015 | $8.0\times10^{-5}$ | 0.0057 | 1350 | 82 | piston motion |
| C-7 | lead | $1.6\times10^{10}$ | 0.0015 | $8.0\times10^{-5}$ | 0.0016 | 1480 | 80 | piston motion |
| C-8 | magnesium alloy | $4.0\times10^{10}$ | 0.0015 | $8.0\times10^{-5}$ | 0.00064 | 1720 | 76 | flexion motion |
| C-9 | aluminum | $7.0\times10^{10}$ | 0.0015 | $8.0\times10^{-5}$ | 0.00034 | 1780 | 74 | flexion motion |
| C-10 | titanium | $11.6\times10^{10}$ | 0.0015 | $8.0\times10^{-5}$ | 0.00024 | 1830 | 70 | flexion motion |
| C-11 | phosphor bronze | $12.0\times10^{10}$ | 0.0015 | $8.0\times10^{-5}$ | 0.00022 | 1950 | 67 | flexion motion |
| C-12 | copper | $13.0\times10^{10}$ | 0.0015 | $8.0\times10^{-5}$ | 0.00020 | 1980 | 64 | flexion motion |

Embodiment 20B

Embodiment 20b changed the outer diameters of supporting member 45 and circular seat 20, and changed length L of vibration film intervening section A. In this Example, length L of vibration intervening section A was changed, and structural components except for seat 20 and vibration 30 are the same as those of Example 2, and evaluation conditions are also the same as Example 2. As shown in FIG. 36, distance X2 between the outer periphery of piezo-electric element 10 and the outer periphery of seat 20 was adjusted, and length L of vibration film intervening section A was changed.

The specific configuration of each component is as follows.
Piezo-Electric Element 10: Same as Example 2 (Outer Diameter=$\phi$16 mm)
Seat 20: The outer diameter was changed such that vibration film intervening section A is in a range of 0.05 mm to 2.0 mm.
Vibration Film 31: The length of vibration film intervening section A was changed to 0.05 mm to 2.0 mm.
Supporting Member 45: Same as Example 2
Table 6 shows the results of the flection amount 6, vibration mode, and resonant frequency f0 and sound pressure level when length L of vibration film intervening section A was changed.

TABLE 6

| No. | DISTANCE × 2 (m) | MATERIAL OF VIBRATION FILM | THICKNESS OF VIBRATION FILM (m) | MAXIMUM FLECTION AMOUNT δ (m) | $F_0$ (Hz) | SOUND PRESSURE LEVEL (dB) | VIBRATION MODE |
|---|---|---|---|---|---|---|---|
| D-1 | 0.00005 | urethane | $8.0 \times 10^{-5}$ | 0.0000024 | 2700 | 53 | flexion motion |
| D-2 | 0.0001 | urethane | $8.0 \times 10^{-5}$ | 0.00002 | 2400 | 69 | flexion motion |
| D-3 | 0.0005 | urethane | $8.0 \times 10^{-5}$ | 0.0025 | 1010 | 85 | piston motion |
| D-4 | 0.001 | urethane | $8.0 \times 10^{-5}$ | 0.022 | 1030 | 87 | piston motion |
| D-5 | 0.0015 | urethane | $8.0 \times 10^{-5}$ | 0.066 | 847 | 84 | piston motion |
| D-6 | 0.002 | urethane | $8.0 \times 10^{-5}$ | 0.016 | 760 | 81 | piston motion |

Example 20C

This Example 20c changed only the thickness of the vibration film. In this Example, the thickness of the vibration film alone was changed, and structural components are the same as those of Example 2 except for the vibration film, and evaluation conditions are also the same as Example 2.

The specific configuration of each component is as follows.

Piezo-Electric Element 10: Same as Example 2 (Outer Diameter=φ16 mm)

Seat 20: Same as Example 2 (Outer Diameter=φ18 mm)

Vibration Film 31: The thickness of the vibration film was changed such that the thickness is in a range of 5 μm to 1 mm. Same as Example 2 (Outer Diameter=φ21 mm)

Supporting Member 45: Same as Example 2

Table 7 shows the results of the flection amount, vibration mode, and resonant frequency f0 and sound pressure level when the thickness of the vibration film was changed.

TABLE 7

| No. | THICKNESS OF VIBRATION FILM (m) | MATERIAL OF VIBRATION FILM | MAXIMUM FLECTION AMOUNT δ (m) | $F_0$ (Hz) | SOUND PRESSURE LEVEL | VIBRATION MODE |
|---|---|---|---|---|---|---|
| E-1 | $5 \times 10^{-6}$ | urethane | 270 | 540 | 73 | flexion motion |
| E-2 | $1 \times 10^{-5}$ | urethane | 33.8 | 620 | 76 | flexion motion |
| E-3 | $2 \times 10^{-5}$ | urethane | 4.28 | 710 | 80 | piston motion |
| E-4 | $3 \times 10^{-5}$ | urethane | 1.25 | 760 | 81 | piston motion |
| E-5 | $5 \times 10^{-5}$ | urethane | 0.27 | 812 | 82 | piston motion |
| E-6 | $8 \times 10^{-5}$ | urethane | 0.066 | 847 | 84 | piston motion |
| E-7 | $1 \times 10^{-4}$ | urethane | 0.034 | 957 | 86 | piston motion |
| E-8 | $1.5 \times 10^{-4}$ | urethane | 0.001 | 1210 | 82 | piston motion |
| E-9 | $2 \times 10^{-4}$ | urethane | 0.0042 | 1540 | 80 | piston motion |
| E-10 | $5 \times 10^{-4}$ | urethane | 0.00027 | 1700 | 72 | flexion motion |
| E-11 | $1 \times 10^{-3}$ | urethane | 0.000034 | 2100 | 64 | flexion motion |
| E-12 | $2 \times 10^{-3}$ | urethane | 0.0000042 | 2470 | 54 | flexion motion |

As can be seen from the result of Table 5, for making the vibration mode of the piezo-electric actuator into the piston motion type, flection amount δ of vibration film intervening section A may be adjusted to be equal to or smaller than 0.0016. For example, (a) when an actuator is designed to have a resonant frequency of approximately 1 kHz (including 1001 Hz) or lower in favor of reproduction in a low sound region, conditions as shown in No. C-1-C-3 in the table may be utilized. On the other hand, (b) when one wants to design an actuator with 80 dB or more in favor of the sound pressure level, conditions as shown in No. C-1-C-7 in the table may be utilized.

As described above, in the piezo-electric actuator according to the present invention, the motion mode can be adjusted to the piston type by adjusting flection amount δ of vibration film intervening section A, making it possible to realize a good acoustic characteristic. Further, through the adjustment of flection amount δ, the resonant frequency and sound pressure level can be adjusted to desired values.

As can be seen from the results of Table 6, for making the vibration mode of the piezo-electric actuator into the piston motion type, flection amount δ of vibration film intervening section A may be adjusted to be equal to or smaller than 0.0025. For example, (a) when an actuator is designed to have a resonant frequency of approximately 1 kHz (including 1001 Hz) or lower in favor of reproduction in a low sound region, conditions as shown in No. D-5-D-6 in the table may be utilized. (b) On the other hand, when one wants to design an actuator with 80 dB or more in favor of the sound pressure level, conditions as shown in No. D-3-D-6 in the table may be utilized.

As can be seen from the results of Table 7, for example, (a) when an actuator is designed to have a resonant frequency of approximately 1 kHz (including 1001 Hz) or lower in favor of reproduction in a low sound region, conditions as shown in No. E-3-E-7 in the table may be utilized. (b) On the other hand, when one wants to design an actuator with 80 dB or more in favor of the sound pressure level, conditions as shown in No. E-3-B-9 in the table may be utilized.

Summarizing the results of the aforementioned Tables 5-7, the vibration mode can be set to the piston type by adjusting flection amount δ of vibration film intervening section A in a range of predetermined values 0.001 to 5, making it possible to achieve a good acoustic characteristic with a high sound pressure level. Also, through the adjustment of flection amount δ, the resonant frequency can be adjusted. In this way, the ability to adjust the resonant frequency and sound pressure characteristic by controlling flection amount δ

The invention claimed is:

1. A piezo-electric actuator comprising:
   a piezo-electric element for performing expansion/contraction motions in accordance with an electric field state;

a seat to which said piezo-electric element is adhered on at least one surface thereof; and a supporting member for supporting said piezo-electric element and said seat, wherein said seat is connected to said supporting member through a vibration film which is less rigid than said seat, a plurality of beams are formed on the outer periphery of said seat to extend outward in a plane parallel with a surface on which said piezo-electric element is adhered, and said piezo-electric element and said seat vibrate in a thickness direction of said piezo-electric element in accordance with the expansion/contraction motions of said piezo-electric element.

2. The piezo-electric actuator according to claim 1, wherein:

a vibration film intervening section is formed between the inner periphery of said supporting member and the outer periphery of said seat, and a flection amount δ of said vibration film intervening section A calculated by the following Equation 1 is in a range of 0.001 to 5:

$$\delta = (W \cdot L^3)/(3 \cdot E \cdot I) \quad \text{(Equation 1)}$$

where L=the length (m) of said vibration film intervening section, E=modulus of direct elasticity of the material of the vibration film (N/m²), W=a load (N), and I=moment of inertia (m⁴), where said moment of inertia (I) is calculated by the following Equation 2:

$$I = (b \cdot h3)/12 \quad \text{(Equation 2)}$$

where b=the width of said vibration film intervening section=0.001 (m), and h=the thickness (m) of the vibration film.

3. The piezo-electric actuator according to claim 1, wherein said plurality of beams are arranged at equal intervals to each other.

4. The piezo-electric actuator according to claim 1, wherein a curved section is formed by creating a three-dimensional curve of said vibration film in the thickness direction in a peripheral section of the area of said vibration film on which said seat is disposed.

5. The piezo-electric actuator according to claim 1, wherein said vibration film is a resin material which is made of a urethane, a PET, or a polyethylene film.

6. The piezo-electric actuator according to claim 1, wherein said vibration film is made of a material which has a modulus of elasticity smaller than said seat.

7. The piezo-electric actuator according to claim 1, further comprising a piezo-electric element other than said piezo-electric element to configure a bimorph type element.

8. The piezo-electric actuator according to claim 1, wherein said piezo-electric element has a laminated structure which comprises alternately laminated piezo-electric material layers and electrode layers.

9. The piezo-electric actuator according to claim 1, wherein both said piezo-electric element and said seat have a circular contour shape.

10. The piezo-electric actuator according to claim 1, wherein said piezo-electric element has a square contour shape.

11. The piezo-electric actuator according to claim 1, wherein said vibration film has a rectangular contour shape.

12. The piezo-electric actuator according to claim 9, wherein said vibration film also has a circular contour shape, and said piezo-electric element, said seat, and said vibration film are placed in a concentric arrangement.

13. An electronic device comprising the piezo-electric actuator according to claim 1 as an acoustic element.

14. The piezo-electric actuator according to claim 1, wherein said plurality of beams are 4 or more beams.

15. The piezo-electric actuator according to claim 1, wherein said seat includes a restraining section which is an area on which said piezo-electric element is adhered, and a non-restraining section which is an area surrounding said restraining section.

16. The piezo-electric actuator according to claim 1, wherein an opening is formed in at least part of an area on which said seat is disposed within said vibration film.

* * * * *

UNITED STATES PATENT AND TRADEMARK OFFICE
CERTIFICATE OF CORRECTION

PATENT NO. : 8,319,396 B2  
APPLICATION NO. : 12/159427  
DATED : November 27, 2012  
INVENTOR(S) : Yasuharu Onishi et al.

Page 1 of 1

It is certified that error appears in the above-identified patent and that said Letters Patent is hereby corrected as shown below:

In the Specification

Column 19, Line 64: delete "diameter=22" and insert -- diameter=φ22 --

Column 24, Line 38: delete "diameter=21" and insert -- diameter=φ21 --

Column 28, Line 61: delete "45:" and insert -- 45: Outer --

Column 34, Line 62: After "δ" insert -- with the thickness of the vibration film, length L of vibration film intervening section A, and the material of the vibration film means that an acoustic design can be readily performed, and provides a high use value. --

In the Claims

Column 35, Line 33: In Claim 2, delete "I=(b·h3)/12" and insert -- I=(b•h$^3$)/12 --

Signed and Sealed this  
Fifth Day of August, 2014

Michelle K. Lee  
*Deputy Director of the United States Patent and Trademark Office*